(12) United States Patent
Xiong et al.

(10) Patent No.: US 11,881,344 B2
(45) Date of Patent: Jan. 23, 2024

(54) POWER SYSTEM

(71) Applicant: Delta Electronics, Inc., Taoyuan (CN)

(72) Inventors: Yahong Xiong, Taoyuan (TW); Da Jin, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 18/117,374

(22) Filed: Mar. 3, 2023

(65) Prior Publication Data

US 2023/0230749 A1 Jul. 20, 2023

Related U.S. Application Data

(63) Continuation of application No. 17/330,270, filed on May 25, 2021, now Pat. No. 11,626,237, which is a (Continued)

(30) Foreign Application Priority Data

Dec. 12, 2018 (CN) .......................... 201811519354.1
Sep. 23, 2019 (CN) .......................... 201910900102.1

(51) Int. Cl.
*H05K 1/14* (2006.01)
*H01F 27/28* (2006.01)
(Continued)

(52) U.S. Cl.
CPC ......... *H01F 27/2804* (2013.01); *G05F 1/575* (2013.01); *G06F 1/183* (2013.01);
(Continued)

(58) Field of Classification Search
CPC ...... H05K 7/1427; H05K 1/181; H05K 1/186; G06F 1/575; G06F 1/183; H01F 27/02; H01F 27/2804; H01F 27/292
(Continued)

(56) References Cited

U.S. PATENT DOCUMENTS 5,229,916 A 7/1993 Frankeny et al.
5,515,604 A 5/1996 Horine et al.
(Continued)

FOREIGN PATENT DOCUMENTS

CN 102301435 A 12/2011
CN 202406391 U 8/2012
(Continued)

*Primary Examiner* — Hung S. Bui
(74) *Attorney, Agent, or Firm* — KIRTON McCONKIE; Evan R. Witt

(57) ABSTRACT

A power system includes a power module, an electronic load and a system board. The power module includes a first surface, a second surface, a switch and a plurality of conductive parts, wherein the switch is disposed on the first surface of the power module and the plurality of conductive parts are disposed on the second surface of the power module. The electronic load includes a plurality of conductive parts. The power module and the electronic load are disposed on two opposite sides of the system board, the power module delivers power to the electronic load through the system board, and gaps and networks of the plurality of conductive parts of the power module correspond to those of the plurality of conductive parts of the electronic load.

25 Claims, 19 Drawing Sheets

Related U.S. Application Data continuation of application No. 16/591,451, filed on Oct. 2, 2019, now Pat. No. 11,158,451.

(60) Provisional application No. 62/770,432, filed on Nov. 21, 2018, provisional application No. 62/743,251, filed on Oct. 9, 2018.

(51) Int. Cl.

| | | |
|---|---|---|
| *G05F 1/575* | (2006.01) | |
| *H01F 27/02* | (2006.01) | |
| *H01F 27/29* | (2006.01) | |
| *G06F 1/18* | (2006.01) | |
| *H01F 17/04* | (2006.01) | |
| *H05K 1/02* | (2006.01) | |
| *H05K 1/16* | (2006.01) | |
| *H05K 1/18* | (2006.01) | |
| *H05K 7/14* | (2006.01) | |
| *H05K 7/20* | (2006.01) | |
| *H01L 25/16* | (2023.01) | |
| *H01R 12/52* | (2011.01) | |
| *H01R 12/58* | (2011.01) | |
| *H02M 3/158* | (2006.01) | |
| *H05K 1/11* | (2006.01) | |
| *H01F 17/06* | (2006.01) | |
| *H02M 3/00* | (2006.01) | |
| *H01F 27/24* | (2006.01) | |
| *H05K 3/28* | (2006.01) | |

(52) U.S. Cl.
CPC ............ *H01F 17/04* (2013.01); *H01F 17/06* (2013.01); *H01F 27/02* (2013.01); *H01F 27/24* (2013.01); *H01F 27/292* (2013.01); *H01L 25/16* (2013.01); *H01R 12/52* (2013.01); *H01R 12/58* (2013.01); *H02M 3/003* (2021.05); *H02M 3/1584* (2013.01); *H05K 1/0203* (2013.01); *H05K 1/111* (2013.01); *H05K 1/117* (2013.01); *H05K 1/145* (2013.01); *H05K 1/165* (2013.01); *H05K 1/181* (2013.01); *H05K 1/186* (2013.01); *H05K 3/284* (2013.01); *H05K 7/1427* (2013.01); *H05K 7/2089* (2013.01); *H05K 2201/1003* (2013.01); *H05K 2201/10015* (2013.01); *H05K 2201/10053* (2013.01); *H05K 2201/10166* (2013.01); *H05K 2201/10522* (2013.01); *H05K 2201/10636* (2013.01); *H05K 2201/10734* (2013.01); *H05K 2201/10984* (2013.01)

(58) Field of Classification Search
USPC .......................................... 361/737
See application file for complete search history.

(56) References Cited

U.S. PATENT DOCUMENTS

| | | |
|---|---|---|
| 6,420,953 B1 | 7/2002 | Dadafshar |
| 6,927,661 B2 | 8/2005 | He et al. |
| 6,982,876 B1 | 1/2006 | Young |
| 8,498,124 B1 | 7/2013 | Folker et al. |
| 9,263,177 B1 | 2/2016 | Ikriannikov et al. |
| 9,729,059 B1 | 8/2017 | Parto |
| 11,166,373 B2 | 11/2021 | Xiong et al. |
| 2004/0113741 A1 | 6/2004 | Li et al. |
| 2004/0239463 A1 | 12/2004 | Poniatowski et al. |
| 2005/0083665 A1 | 4/2005 | Nakashima et al. |
| 2005/0168961 A1 | 8/2005 | Ono et al. |
| 2006/0038549 A1 | 2/2006 | Mehrotra et al. |
| 2006/0133042 A1 | 6/2006 | Belady et al. |
| 2009/0201624 A1 | 8/2009 | Hattori et al. |
| 2009/0231885 A1 | 9/2009 | Won et al. |
| 2010/0259882 A1 | 10/2010 | Song |
| 2010/0321140 A1 | 12/2010 | Tanaka et al. |
| 2011/0148560 A1 | 6/2011 | Ikriannikov |
| 2011/0234196 A1 | 9/2011 | Chiba |
| 2011/0317387 A1 | 12/2011 | Pan et al. |
| 2013/0049730 A1 | 2/2013 | Kato |
| 2013/0170258 A1 | 7/2013 | Calvin et al. |
| 2014/0313003 A1 | 10/2014 | Liu et al. |
| 2015/0282370 A1 | 10/2015 | Yang et al. |
| 2016/0086723 A1 | 3/2016 | Su et al. |
| 2016/0093432 A1 | 3/2016 | Chung et al. |
| 2016/0126177 A1 | 5/2016 | Ergas |
| 2018/0122562 A1 | 5/2018 | Ji et al. |
| 2018/0166239 A1* | 6/2018 | Larson ................. H05K 1/148 |
| 2018/0323702 A1 | 11/2018 | Zhou et al. |
| 2019/0354154 A1 | 11/2019 | Yates et al. |

FOREIGN PATENT DOCUMENTS

| | | |
|---|---|---|
| CN | 103096646 A | 5/2013 |
| CN | 103298258 A | 9/2013 |
| CN | 203368934 U | 12/2013 |
| CN | 104603941 A | 5/2015 |
| CN | 105425918 A | 3/2016 |
| CN | 105487619 A | 4/2016 |
| CN | 206877816 U | 1/2018 |
| CN | 206961615 U | 2/2018 |
| CN | 108022917 A | 5/2018 |
| CN | 108288919 A | 7/2018 |
| CN | 108447841 A | 8/2018 |
| CN | 108811320 A | 11/2018 |
| CN | 108880283 A | 11/2018 |
| WO | 2010053821 A2 | 5/2010 |

\* cited by examiner

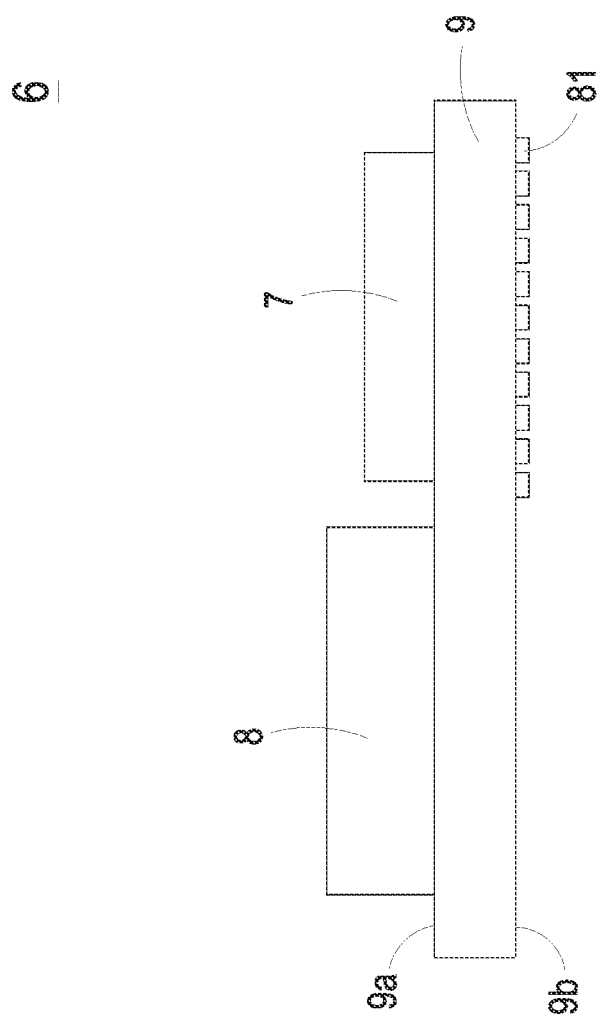

POWER SYSTEM

CROSS-REFERENCE TO RELATED APPLICATION

This application is a Continuation Application of U.S. patent application Ser. No. 17/330,270 filed on May 25, 2021, which is a Continuation Application of U.S. patent application Ser. No. 16/591,451 filed on Oct. 2, 2019 and entitled "POWER MODULE", which claims the benefit of U.S. Provisional Application Ser. No. 62/743,251 filed on Oct. 9, 2018, claims the benefit of U.S. Provisional Application Ser. No. 62/770,432 filed on Nov. 21, 2018, claims priority to China Patent Application No. 201811519354.1 filed on Dec. 12, 2018, and claims priority to China Patent Application No. 201910900102.1 filed on Sep. 23, 2019, the entire contents of which are incorporated herein by reference for all purposes.

FIELD OF THE INVENTION

The present disclosure relates to a power module, and more particularly to a power system having a power module capable of reducing the power loss and enhancing the heat dissipating efficiency.

BACKGROUND OF THE INVENTION

FIG. 1A is a schematic side view illustrating the configuration of a conventional electronic device. FIG. 1B is a schematic view illustrating the structure of a conventional power module of the electronic device of FIG. 1A. As shown in FIGS. 1A and 1B, the conventional electronic device 6 includes a central processing unit (CPU) 7, a power module 8 and a system board 9. The power module 8 is served as a voltage regulator module (VRM) and converts an input power into a regulated power to be supplied to the central processing unit 7. The power module 8 and the central processing unit 7 are disposed on a first surface 9a of the system board 9. The power module 8 comprises a plurality of output capacitors 81, a magnetic core 82, a printed circuit board (PCB) 83 and a plurality of copper bars 84, 85.

The output capacitors 81 of the power module 8 are disposed on a second surface 9b of the system board 9, wherein the second surface 9b is opposite to the first surface 9a. The output capacitors 81 are corresponding to and located under the central processing unit 7. The magnetic core 82 is disposed on the printed circuit board 83. The printed circuit board 83 is disposed on the first surface 9a of the system board 9. The copper bars 84, 85 are magnetically coupled with the magnetic core 82 to form the output inductors of the power module 8. A gap 86 is formed between the printed circuit board 83 and the magnetic core 82. A plurality of switch elements are disposed on the printed circuit board 83 and located in the gap 86. The heat from the power module 8 can be transferred to the system board 9 through the printed circuit board 83. Moreover, the heat is dissipated away through a heat dissipation mechanism (not shown) of the system board 9. In this conventional electronic device, the thermal resistance between the heat sources (for example the copper bars 84, 85 or the switch elements) and the system board 9 is caused by the printed circuit board 83 of the power module 8 and is small. Consequently, the heat generated from the power module 8 can be transferred to the system board 9 to be dissipated away.

Recently, the required current for the central processing unit is gradually increased, and the trend of the volume of the electronic device is toward miniaturization. For meeting the requirements, the output current of the power module (i.e. VRM) is increased, so that the output voltage drop is becoming larger. Nowadays, in order to reduce the volume of the electronic device, enhance the dynamic switching performance of the power module and enhance the main frequency of the central processing unit, another electronic device is disclosed. In another conventional electronic device, the central processing unit and the power module are disposed on the opposite surfaces of the system board to shorten the layout path between the output terminal of the power module and the input terminal of the central processing unit. In addition, the layout of the inner components of the power module is adjusted. For example, the installation position of the output capacitor is changed from the second surface of the system board to the inner space of the power module. Consequently, the volume of the electronic device is effectively reduced. Although the dynamic switching performance of the power module of the electronic device is enhanced and the volume of the electronic device is reduced, there are still some drawbacks. For example, the power module can't meet the thermal requirements because the heat from the power module fails to be conducted to the system board due to the other heat source, for example the central processing unit. The power module has a first surface in thermal contact with a casing of the electronic device or a heatsink and a second surface fixed on the system board. The thermal resistance between the heat sources of the power module and the first surface of the power module is larger than the thermal resistance between the heat sources of the power module and the second surface of the power module. Therefore, the effect of the thermal conduction between the power module and the casing of the electronic device is not satisfied. Namely, the heat from power module cannot be effectively transferred to the casing of electronic device and dissipated away through the casing of the electronic device. Moreover, a plurality of ball grid arrays (BGAs) are usually mounted on the printed circuit board of the power module. For allowing the power module to be disposed on the second surface of the system board, the output capacitors are moved from the second surface of the system board to the inner space of the power module, and the location where the output capacitors are originally disposed on the system board is used to settle ball grid arrays so as to electrically connect with the ball grid arrays on the power module. The ball grid array map on the power module matches with the ball grid array map on the system board including the network and pitch. In case that the force applied to the ball grid arrays of the power module is not uniform, the soldering material is possibly cracked or detached and the product reliability is impaired. For solving this problem, the surface of the printed circuit board of the power module has to provide a large space for improving the force on the ball grid arrays. However, the installation space of the output capacitor is restricted. That is, the power module cannot be equipped with more output capacitors according to the practical requirements.

Therefore, there is a need of providing a power module in order to overcome the drawbacks of the conventional technologies.

SUMMARY OF THE INVENTION

The present disclosure provides a power system having a power module for reducing the power loss of the output inductors, reducing the thermal resistance, enhancing the heat dissipating efficiency, obtaining suitable inductance, disposing more output capacitors therein and/or decreasing the volume thereof.

In accordance with an aspect of the present disclosure, a power system is provided. The power system includes a power module, an electronic load and a system board. The power module includes a first surface, a second surface, a switch and a plurality of conductive parts, wherein the switch is disposed on the first surface of the power module and the plurality of conductive parts are disposed on the second surface of the power module. The electronic load includes a plurality of conductive parts. The power module and the electronic load are disposed on two opposite sides of the system board, the power module delivers power to the electronic load through the system board, and gaps and networks of the plurality of conductive parts of the power module correspond to those of the plurality of conductive parts of the electronic load.

The above contents of the present disclosure will become more readily apparent to those ordinarily skilled in the art after reviewing the following detailed description and accompanying drawings, in which:

BRIEF DESCRIPTION OF THE DRAWINGS

FIG. 1A is a schematic side view illustrating the configuration of a conventional electronic device;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1B:
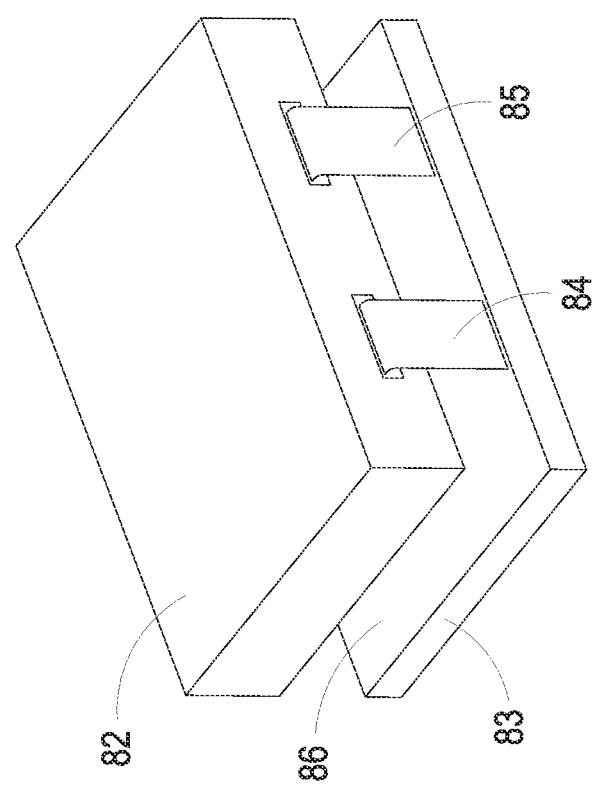
FIG. 1B is a schematic view illustrating the structure of a conventional power module of the electronic device of FIG. 1A.
Figure 2A:
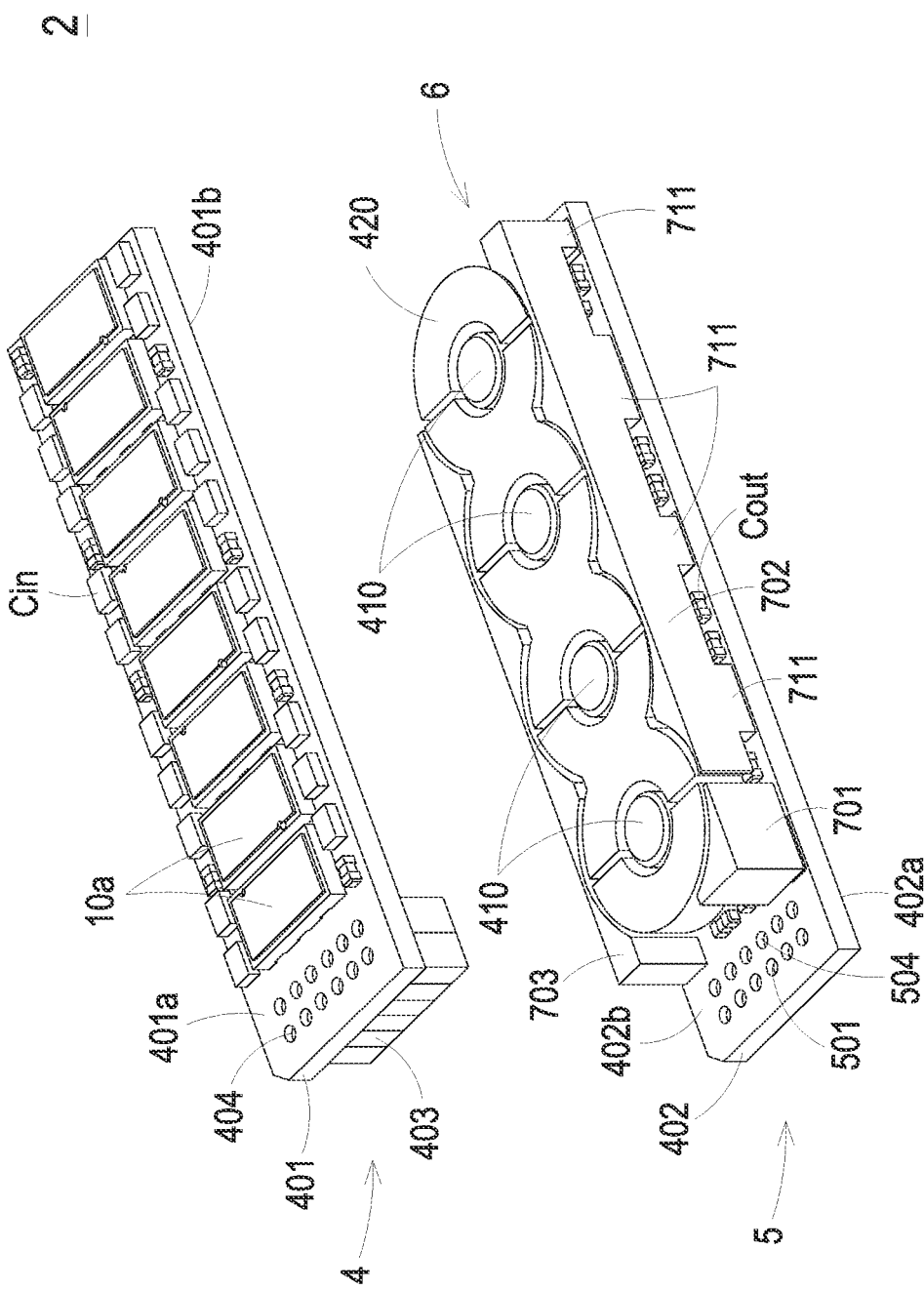
FIG. 2A is a first schematic exploded view illustrating a power module according to a first embodiment of the present disclosure.
Figure 2B:
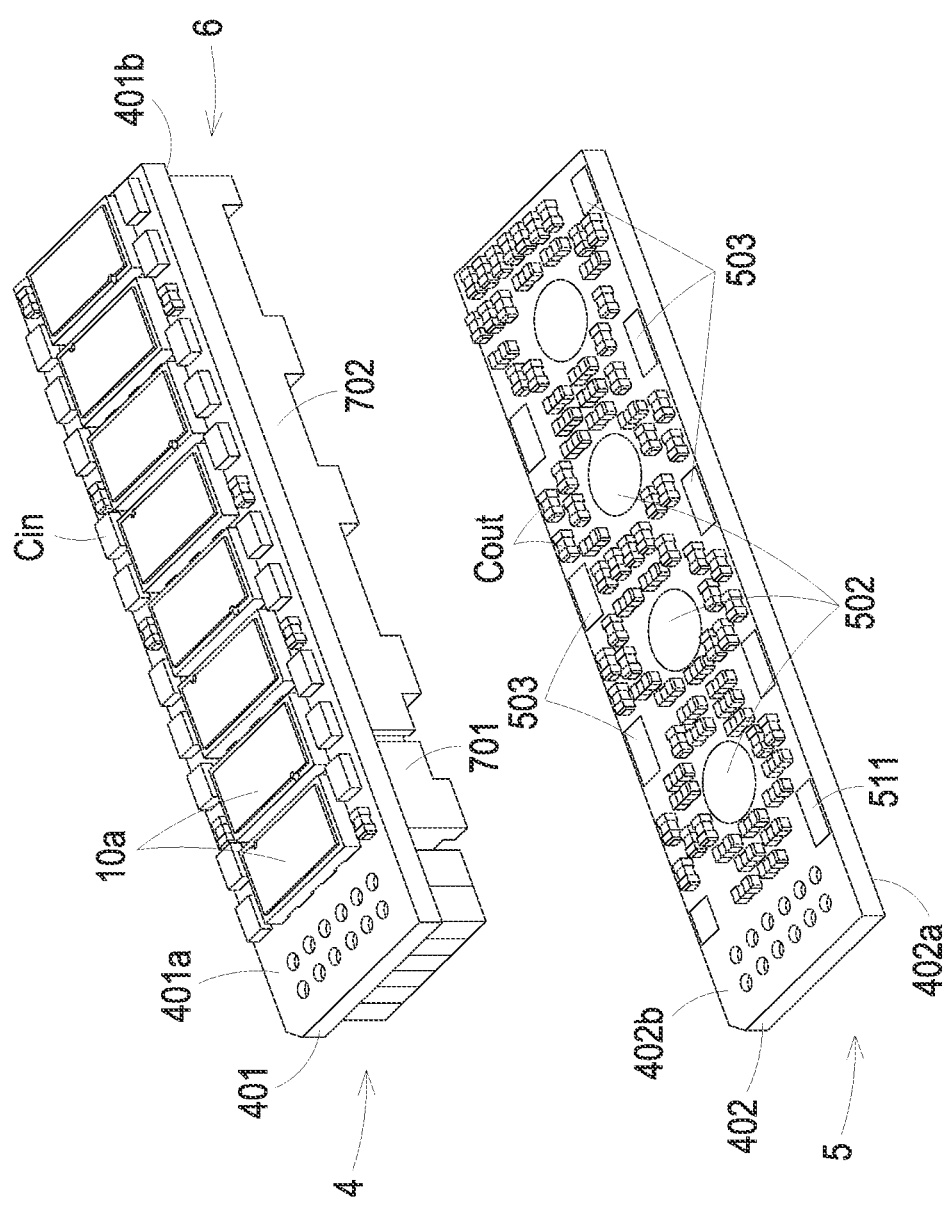
FIG. 2B is a second schematic exploded view illustrating the power module of FIG. 2A.
Figure 3:
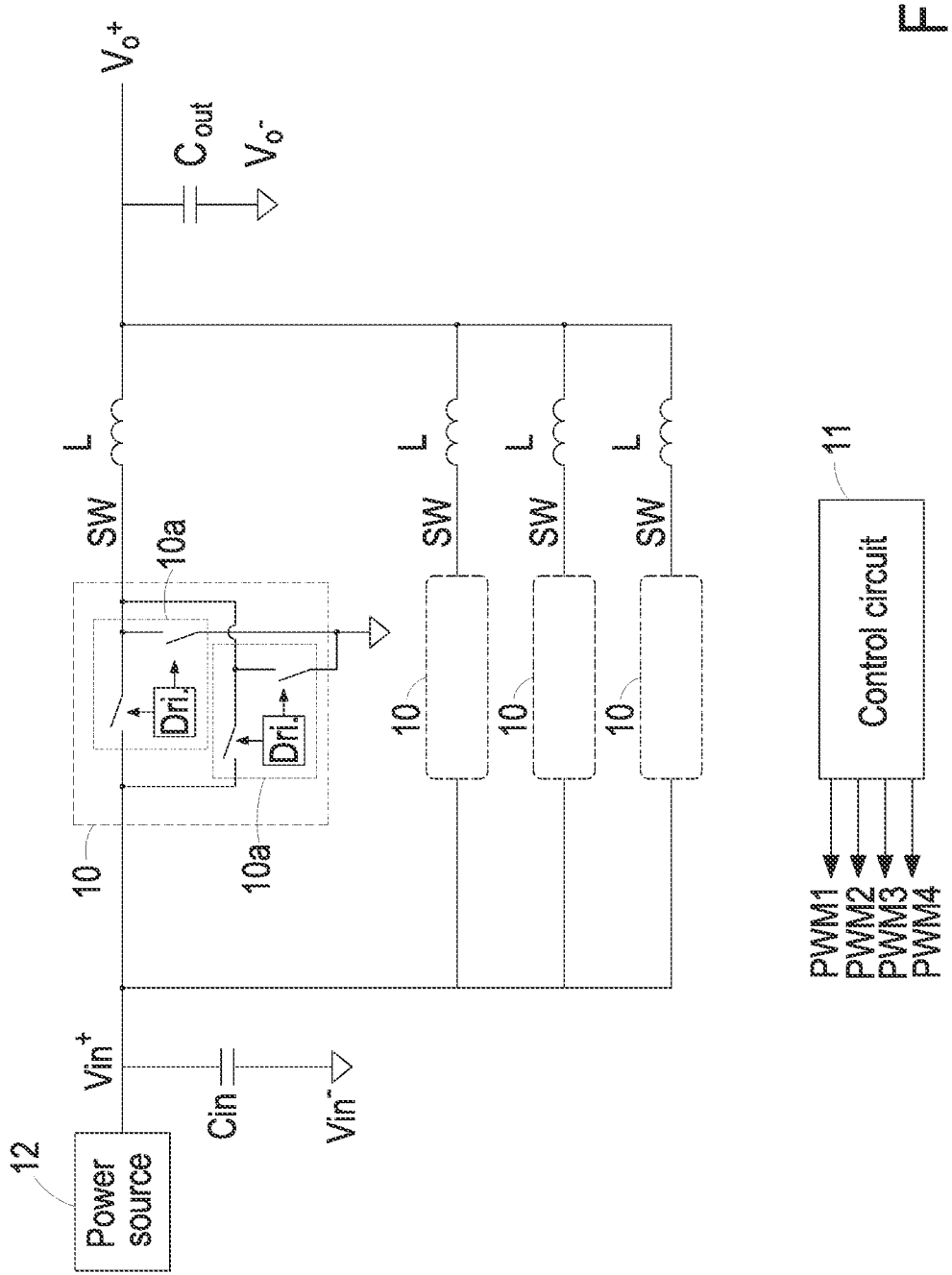
FIG. 3 is a schematic equivalent circuit diagram illustrating the power module of FIG. 2A.
Figure 4:
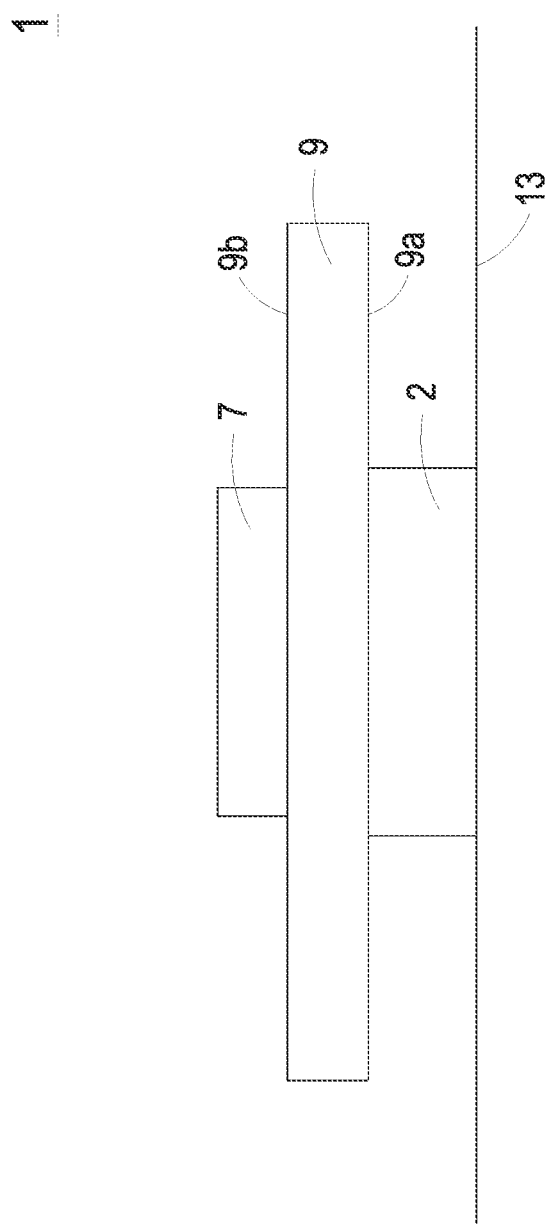
FIG. 4 is a schematic assembled view illustrating the power module of FIG. 2A assembled with a central processing unit and a system board to form an electronic device.

FIG. 2A is a first schematic exploded view illustrating a power module according to a first embodiment of the present disclosure. FIG. 2B is a second schematic exploded view illustrating the power module of FIG. 2A. FIG. 3 is a schematic equivalent circuit diagram illustrating the power module of FIG. 2A. FIG. 4 is a schematic assembled view illustrating the power module of FIG. 2A assembled with a central processing unit and a system board to form an electronic device. As shown in FIGS. 2A, 2B, 3 and 4, the power module 2 is served as a voltage regulator module (VRM) and is applied in an electronic device 1. In this embodiment, the power module 2 is a multi-phase buck converter, for example but not limited to 4-phase buck converter. As the power module 2 is applied in the electronic device 1 to assembly with a central processing unit 7 and a system board 9, the power module 2 and the central processing unit 7 are disposed on the opposite surfaces of the system board 9. The system board 9 has a first surface 9a and a second surface 9b. The power module 2 disposed on the first surface 9a of the system board 9 is corresponding in position to the central processing unit 7 disposed on the second surface 9b of the system board 9. In case that the central processing unit 7 of the electronic device 1 requires a large amount of current, the power module 2 is the multi-phase buck converter. Consequently, the capability of the power module 2 to output electricity is effectively enhanced.

The power module 2 comprises a plurality of power circuits 10, a plurality of output inductors L, a control circuit 11 and at least one output capacitor Cout. As shown in FIG. 3, each power circuit 10 and the corresponding output inductor L are electrically connected with each other in series to define a phase buck circuit. In this embodiment, the power module 2 comprises four phase buck circuits, i.e. the first phase buck circuit to the fourth phase buck circuit from top to bottom. The four phase buck circuits are electrically connected with each other in parallel and electrically connected between a power source 12 and a first terminal of the output capacitor Cout. In addition, each of the power circuits 10 comprises at least two switch circuits, for example two Dr. MOS elements 10a, which are connected in parallel. Each of the Dr. MOS elements 10a comprises at least one switch and a driver which is used to drive the at least one switch. Preferably but not exclusively, the Dr. MOS element 10a comprises two switches and one driver. In this embodiment, the power module 2 comprises four phase buck circuits so that the power module 2 comprises eight Dr. MOS elements 10a and four output inductors L. The input side of the power module 2 comprises a positive input terminal Vin+ and a negative input terminal Vin−. The output side of the power module 2 comprises a positive output terminal Vo+ and a negative output terminal Vo−. The negative input terminal Vin− and the negative output terminal Vo− are electrically connected with a common terminal. Each of the Dr. MOS elements 10a further comprises a first terminal connected with the positive input terminal Vin+ of the power module 2, a second terminal connected with a ground (i.e. the negative output terminal Vo− of the power module 2) and a third terminal connected with a first terminal SW of the corresponding output inductor L. In each phase buck circuit, the two Dr. MOS elements 10a connected in parallel can increase the maximum output power and decrease the conduction loss of the switches.

Moreover, the output inductors L can be independent with each other. In other embodiments, the output inductors L can also be coupled together to reduce the ripple of the output current of the power module 2. The first terminal of the output capacitor Cout is electrically connected with the positive output terminal Vo+ of the power module 2, and a second terminal of the output capacitor Cout is electrically connected with the negative output terminal Vo− (i.e., ground) of the power module 2. In some embodiments, the power module 2 further comprises at least one input capacitor Cin. A first terminal of the input capacitor Cin is electrically connected with the positive input terminal Vin+ of the power module 2. A second terminal of the input capacitor Cin is electrically connected with the negative input terminal Vin− of the power module 2. By this way, the ripple current of the input capacitors Cin and the output capacitors Cout are minimized, and the numbers and the size of the input capacitor Cin and the output capacitor Cout can also be minimized.

In this embodiment, the control circuit 11 senses the output voltage of the power module 2 and the output current of each phase buck circuit and generates four pulse width modulation signals PWM1, PWM2, PWM3 and PWM4 accordingly so as to control the power circuit 10 in each phase buck circuit. Since the power module 2 comprises four phases, the phase difference between every two adjacent pulse width modulation signals is 90 degrees. Each phase buck circuit is controlled by the control circuit 11 according to one pulse width modulation signal. For example, the first phase buck circuit is controlled according to the first pulse width modulation signal PWM1, the second phase buck circuit is controlled according to the second pulse width modulation signal PWM2, the third phase buck circuit is controlled according to the third pulse width modulation signal PWM3, and the fourth phase buck circuit is controlled according to the fourth pulse width modulation signal PWM4.

In accordance with a feature of the present disclosure, the power module 2 is a multi-layered structure with more than two layers. Consequently, the ability of the power module 2 to withstand the pressure from the casing of the electronic device is increased, and the heat from the power module 2 is effectively transferred to a casing of the electronic device or a heatsink. In the embodiment, as shown in FIGS. 2A and 2B, the power module 2 comprises a first circuit board assembly 4, a second circuit board assembly 5 and a magnetic core assembly 6. The first circuit board assembly 4 comprises a first printed circuit board 401, at least one input capacitor Cin and a plurality of power circuits 10. Each power circuit 10 comprises two switch circuits. Each switch circuit comprises a Dr. MOS element 10a. In this embodiment, the plurality of Dr. MOS elements 10a and the at least one input capacitor Cin are mounted on a first surface 401a of the first printed circuit board 401 by a welding process or through a conductive adhesive. In this embodiment, the eight Dr. MOS elements 10a are arranged in one row. The input capacitors Cin are distributed around the Dr. MOS elements 10a. The first printed circuit board 401 with the Dr. MOS elements 10a may be in contact with a heatsink 13 (as shown in FIG. 4) or a casing of the electronic device so that the heat generated from the power module 2 can be conducted to the heatsink 13 or the casing of the electronic device by the first printed circuit board 401. The operations of the power circuits 10 cause the main portion of heat of the power module 2, and the power circuits 10 are in contact with the heatsink 13 or the casing of the electronic device so that the heat from the power circuits 10 can be conducted to the heatsink 13 or the casing of the electronic device directly. In such way, the thermal resistance is reduced, and the heat dissipating efficacy is enhanced.

Please refer to FIGS. 2A and 2B again. The magnetic core assembly 6 is arranged adjacent to the first circuit board assembly 4. In this embodiment, the magnetic core assembly 6 is disposed between the first circuit board assembly 4 and the second circuit board assembly 5 and arranged beside a second surface 401b of the first printed circuit board 401. The magnetic core assembly 6 comprises a magnetic core portion 420 and a plurality of electrical conductor assemblies. Each of the electrical conductor assemblies comprises at least one first electrical conductor 410. Each of the first electrical conductors 410 is penetrated through the magnetic core portion 420. Consequently, a plurality of output inductors L are defined by the magnetic core portion 420 and the first electrical conductors 410. In this embodiment, the power module 2 comprises four phase buck circuits. This is, the power module 2 includes four output inductors L. As shown in FIGS. 2A and 2B, the magnetic core assembly 6 comprises four first electrical conductors 410. The four first electrical conductors 410 are correlated to the four windings of the four output inductors L. The number of the first electrical conductors 410 corresponds to the number of the output inductors L shown in FIG. 3. Preferably but not exclusively, the power module 2 comprises four first electrical conductors 410 disposed between the second surface 401b of the first printed circuit board 401 and the second surface 402b of the second printed circuit board 402 of the second circuit board assembly 5 and are arranged in a row. A first terminal of each of the first electrical conductors 410, which forms the first terminal SW of a corresponding output inductor L, is soldered on the second surface 401b of the first printed circuit board 401. A second terminal of each of the first electrical conductors 410, which forms the second terminal of a corresponding output inductor L and is electrically connected to the positive output terminal Vo+ of the power module 2, is soldered on the second surface 402b of the second printed circuit board 402.

Figure 5:
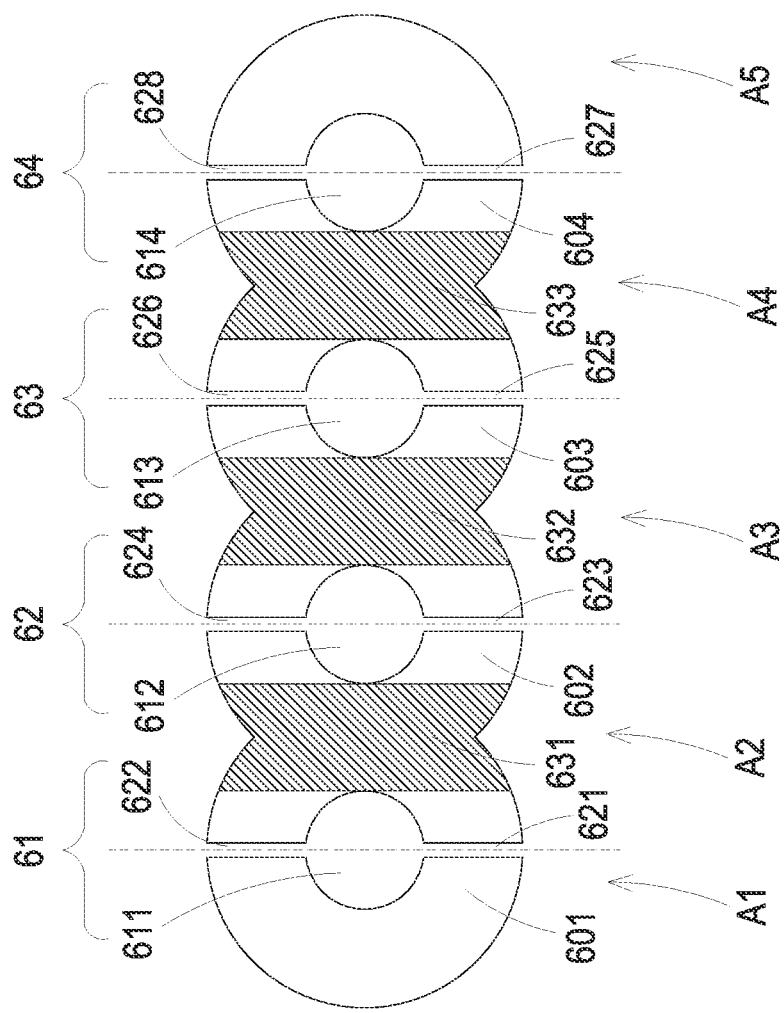
FIG. 5 is a schematic cross-sectional view illustrating the magnetic core portion of the magnetic core assembly of the power module of FIG. 2A.

FIG. 5 is a schematic cross-sectional view illustrating the magnetic core portion of the magnetic core assembly of the power module of FIG. 2A. The magnetic core portion 420 includes a plurality of core units, which are connected with each other. Preferably but not exclusively, the magnetic core portion 420 comprises four core units 61, 62, 63 and 64. It is noted that the number of the core unit is not limited to four and can be varied according to practical requirements. For example, the number of the core unit is one. Each of the core units 61, 62, 63 and 64 is a ring-shaped core. The magnetic core portion 420 further comprises a plurality of holes 611, 612, 613, 614, wherein the number of the holes 611, 612, 613, 614 corresponds to the number of the first electrical conductors 410. In an embodiment, the magnetic core portion 420 comprises four holes 611, 612, 613, 614. The hole 611 is formed in a middle region of the core unit 61, the hole 612 is formed in a middle region of the core unit 62, the hole 613 is formed in a middle region of the core unit 63, and the hole 614 is formed in a middle region of the core unit 64. Preferably but not exclusively, the holes 611, 612, 613, 614 are circular holes. Each of the holes 611, 612, 613, 614 is aligned in position with the corresponding first electrical conductor 410. The sizes and shapes of the holes 611, 612, 613 and 614 match the sizes and shapes of the cross-sectional areas of the first electrical conductors 410, respectively. The first electrical conductors 410 are respectively penetrated through the corresponding holes 611, 612, 613, 614 of the magnetic core portion 420 to define four output inductors L. For example, the first electrical conductor 410 is penetrated through the hole 611. Consequently, the output inductor L of the first phase buck circuit is defined by the first electrical conductor 410 and the core unit 61 collaboratively. The rest may be deduced by analogy. In this embodiment, since the first electrical conductor 410 has good supporting property and thermal conductivity, the first electrical conductor 410 can be arranged between the first circuit board assembly 4 and the second circuit board assembly 5 to support the first circuit board assembly 4 and the second circuit board assembly 5. Consequently, the capability of the power module 2 to withstand the pressure from the casing of the electronic device will be enhanced. Due to the good thermal conductivity of copper, the heat from the output inductors L can be transferred rapidly and effectively. Consequently, the thermal resistance in the thermal conduction path is decreased. Due to low resistivity of copper, the conduction resistance of the output inductor L is decreased. Consequently, the conduction loss of the output inductor L is decreased, and the conversion efficiency of the power module 2 is increased.

Please refer to FIGS. 2A, 2B, 3 and 4 again. The second circuit board assembly 5 comprises a second printed circuit board 402 and at least one output capacitor Cout. Preferably, the second circuit board assembly 5 comprises a plurality of output capacitors Cout. The second printed circuit board 402 has a first surface 402a and a second surface 402b. The first surface 402a is opposite to the second surface 402b. The second surface 402b of the second printed circuit board 402 is arranged beside the magnetic core assembly 6. In some embodiments, the plurality of output capacitors Cout are disposed on the second surface 402b of the second printed circuit board 402. In some other embodiments, the output capacitors Cout are embedded within the second printed circuit board 402. The second circuit board assembly 5 further comprises a plurality of ball grid arrays (not shown in FIGS. 2A and 2B). The ball grid arrays are disposed on the first surface 402a of the second printed circuit board 402. The ball grid arrays are electrically connected with the ball grid arrays of the central processing unit 7 on the system board 9. Preferably, the gaps and networks of the ball grid arrays on the first surface 402a of the second printed circuit board 402 correspond to those of the ball grid arrays on the system board 9.

From the above descriptions, since the power module 2 of the present disclosure use the first electrical conductors 410 as the windings of the output inductors L, the power module 2 can reduce the direct current resistances (DCRs) of windings of the output inductors L and reduce the power loss of the output inductors L. In addition, since the first electrical conductors 410 comprise good thermal conductivity and shorter length, the thermal resistance between the power circuits 10 and the system board 9 is reduced by the first electrical conductors 410 so as to benefit the heat dissipation of the power circuits 10. At the same time, suitable inductance can be obtained according to the lengths of the first electrical conductors 410 and the cross-sectional area of the magnetic core portion 420.

In some embodiments, as shown in FIGS. 2A and 2B, the power module 2 further comprises at least one second electrical conductor 701 and a plurality of third electrical conductors 702, 703, for example two third electrical conductors 702, 703. The second electrical conductor 701 is soldered between the second surface 401b of the first printed circuit board 401 and the second surface 402b of the second printed circuit board 402, and the second electrical conductor 701 is located at a first side of the power module 2 and forms the positive input terminal of the power module 2. The third electrical conductor 702 is soldered between the second surface 401b of the first printed circuit board 401 and the second surface 402b of the second printed circuit board 402, and located at the first side of the power module 2. The first side of the power module 2 is the long side of the power module 2. In addition, the third electrical conductor 702 is close to the second electrical conductor 701. The third electrical conductor 703 is soldered between the second surface 401b of the first printed circuit board 401 and the second surface 402b of the second printed circuit board 402, and located at a second side of the power module 2, wherein the second side is opposite to the first side. Moreover, the third electrical conductors 702, 703 form a negative output terminal of the power module 2. Since the power module 2 of the present disclosure employs the second electrical conductor 701 as the positive input terminal of the power module 2 and employs the third electrical conductors 702, 703 as the negative output terminal of the power module 2, the DCR of the positive input terminal and the negative output terminal of the power module 2 can be reduced. Moreover, since the second electrical conductor 701 and the third electrical conductors 702, 703 comprise good thermal conductivity, respectively, the thermal resistance between the power circuits 10 and the system board 9 is decreased further so as to benefit the heat dissipation of the power circuits 10 further.

In this embodiment, the first electrical conductors 410, the second electrical conductors 701 and the third electrical conductors 702, 703 are made of metallic material for example but not limited to copper, aluminum or alloy. In some embodiments, considering performance and cost, preferably but not exclusively, the first electrical conductors 410, the second electrical conductors 701 and the third electrical conductors 702, 703 are made of copper. The shape of the electrical conductors isn't limited, which is designed according to the practical requirements.

In other embodiment, as shown in FIGS. 2A and 2B, the power module 2 further comprises a signal communication part 403 (i.e. a signal pin combination). The signal communication part 403 is soldered between the second surface 402b of the first printed circuit board 401 and the second surface 402b of the second printed circuit board 402 and disposed adjacent to a third side of the first printed circuit board 401. The signal communication part 403 comprises a plurality of pins. The plurality of pins are divided into a first pin group and a second pin group. The first printed circuit board 401 comprises a plurality of through-holes 404. The second printed circuit board 402 comprises a plurality of through-holes 501 and a plurality of blind holes 504. The first terminals of all pins are fixed in the corresponding through-holes 404 of the first printed circuit board 401 by welding. The second terminals of the pins in the first pin group are fixed in the corresponding through-holes 501 of the second printed circuit board 402 by welding. The second terminals of the pins in the second pin group are fixed in the corresponding blind holes 504 of the second printed circuit board 402 by welding. The signal communication part 403 can transmit signals from the first printed circuit board 401 to the second printed circuit board 402 and transmit signals from the second printed circuit board 402 to the first printed circuit board 401. The use of the through-holes 404, 501 are helpful for fixing the position of the signal communication part 403. Due to the blind-holes 504, the first surface 402a of the second printed circuit board 402 is retained to mount more ball grid arrays and an inner space of the second printed circuit board 402 is retained to place more electronic components (i.e. output capacitors Cout). Consequently, the power module 2 can meet the high-power density requirements.

In some embodiments, as shown in FIGS. 2A and 2B, the second printed circuit board 402 comprises a plurality of first soldering pads 502, at least one second solder pad 511 and a plurality of third soldering pads 503. The plurality of first soldering pads 502, the at least one second soldering pad 511 and the plurality of third soldering pads 503 are disposed on the second surface 402b of the second printed circuit board 402. The second surface 402b of the second printed circuit board 402 is arranged beside the magnetic core assembly 6. The plurality of first soldering pads 502 are circular pads. The second terminal of each of the first electrical conductors 410 is soldered on the corresponding first soldering pad 502 of the second printed circuit board 402. In other embodiment, the first soldering pads 502 are rectangle pads so that the space of the first surface 402a of the second printed circuit board 402 can be released for allowing more output capacitors Cout to be disposed thereon, which means the shape of the second terminal of each of the first electrical conductors 410 is different from the shape of the body of each of the first electrical conductors 410. In other words, the shape of the body of each of the first electrical conductors 410 is round, but the shape of the second terminal of each of the first electrical conductors 410 out of the holes 611, 612, 613 and 614 of the magnetic core portion 420 is rectangle. In some embodiments, the second soldering pad 511 is electrically connected with the positive input terminal Vin+ of the power module 2. The third soldering pads 503 are electrically connected with the negative output terminal Vo− of the power module 2. The first soldering pads 502 are electrically connected with the positive output terminal Vo+ of the power module 2. The ball grid arrays are disposed on the first surface 402a of the second printed circuit board 402. The ball grid arrays are electrically connected with the ball grid arrays of the central processing unit on the system board of the electronic device. Preferably, the gaps and networks of the ball grid arrays on the first surface 402a of the second printed circuit board 402 correspond to those of the ball grid arrays on the system board 9. The ball grid arrays are electrically connected with the plurality of soldering pads on the second surface 402b of the second printed circuit board 402 through the internal traces of the second printed circuit board 402.

In some embodiments, each of the second electrical conductor 701 and the two third electrical conductors 702, 703 comprises at least one bump 711. Preferably, the second electrical conductor 701 and the two third electrical conductors 702, 703 comprise a plurality of bumps 711. The bumps 711 are protruded out from the bottom parts of the corresponding second electrical conductor 701 and the third electrical conductors 702, 703, respectively. In addition, the second printed circuit board 402 comprises at least one second soldering pad 511 and a plurality of third soldering pads 503 disposed on the first surface 402a thereof. Preferably, the second soldering pad 511 and the third soldering pads 503 are rectangle pads. The bump 711 of the second electrical conductor 701 is soldered on the second soldering pad 511, and the bumps 711 of the two third electrical conductors 702, 703 are soldered on the corresponding third soldering pads 503, respectively. Moreover, when the bump 711 of the second electrical conductor 701 is soldered on the second soldering pad 511 and the bumps 711 of the two third electrical conductors 702, 703 are soldered on the corresponding third soldering pads 503, a plurality of receiving spaces are formed between the bottom parts of the second electrical conductor 701, the third electrical conductors 702, 703 and the second printed circuit board 402 so that more output capacitors Cout or other electronic components can be disposed on the second printed circuit board 402 and accommodated in the receiving spaces. The shapes of the bump 711 of the second electrical conductor 701 and the bumps 711 of the two third electrical conductors 702, 703 are different from the shape of the body of the second electrical conductor 701 and the two third electrical conductors 702, 703, respectively. Moreover, the shapes of the body of the second electrical conductor 701 and the two third electrical conductors 702, 703 are wave-shaped, but the shapes of the bumps 711 out of the magnetic core portion 420 are rectangle.

Please refer to FIG. 5 again. The magnetic core portion 420 comprises four core units 61, 62, 63, 64 and four holes 611, 612, 613, 614. Each of the core unit 61, 62, 63, 64 comprises ring 601, 602, 603, 604. The core unit 61 comprises a ring 601, the core unit 62 comprises a ring 602 crossing with the ring 601, the core unit 63 comprises a ring 603 crossing with the ring 602, and the core unit 64 comprises a ring 604 crossing with the ring 603. The hole 611 is formed in the middle region of the ring 601, the hole 612 is formed in the middle region of the ring 602, the hole 613 is formed in the middle region of the ring 603, and the hole 614 is formed in the middle region of the ring 604. In the magnetic core portion 420, the magnetic field lines of every two adjacent core units 61, 62, 63, 64 (i.e. the rings 601, 602, 603, 604) are overlapped to create a first magnetic overlapping region. For example, three first magnetic overlapping regions 631, 632 and 633 indicated by oblique lines are shown in FIG. 5. In the three first magnetic overlapping regions 631, 632 and 633, the DC magnetic fluxes are balanced out (i.e. counteracts) and the AC magnetic fluxes are superposed (i.e. overlays). In some embodiments, the area of each first magnetic overlapping region (e.g., 631, 632 or 633) is smaller than two times the area of the non-magnetic overlapping region of each core unit 61, 62, 63, 64. The overlapping regions of FIG. 5 are presented herein for purpose of illustration and description only.

Each of the core units 61, 62, 63 and 64 includes two air gaps. The core unit 61 includes the two air gaps 621 and 622, which are symmetrically arranged at two opposite sides of the holes 611. The core unit 62 includes the two air gaps 623 and 624, which are symmetrically arranged at two opposite sides of the holes 612. The core unit 63 includes the two air gaps 625 and 626, which are symmetrically arranged at two opposite sides of the hole 613. The core unit 64 includes the two air gaps 627 and 628, which are symmetrically arranged at two opposite sides of the hole 614. These air gaps 621 to 628 can withstand the magnetic pressure averagely. Preferably, the magnetic core portion 420 is an integral structure. Moreover, the combination of the magnetic core portion 420 and the first electrical conductors 410 is installed between the first circuit board assembly 4 and the second circuit board assembly 5.

All air gaps 621 to 628 of the core units 61 to 64 are located at the corresponding no-overlapping regions. Moreover, depending on the different specification of the power module 2, each core units 61 to 64 also can comprises single air gap.

Besides, the air gaps 621 to 628 can separate the magnetic core portion 420 into five parts A1, A2, A3, A4, A5. The five parts A1, A2, A3, A4, A5 are adhered or assembled together by dielectric materials and the air gaps 621 to 628 are formed at the same time, wherein the dielectric materials may be a material with low magnetic permeability.

In some embodiments, the magnetic core portion 420 may be assembled with the first electrical conductors 410 to form four output inductors L firstly, and then the heat generated by the magnetic core portion 420 can be conducted to the first electrical conductors 410 effectively and the four output inductors L can be convenient to assemble with the first printed circuit board 401 and the second printed circuit board 402. In some embodiments, the magnetic core portion 420, the first electrical conductors 410, the second electrical conductor 701, the third electrical conductors 702 and 703 and the signal communication part 403 are assembled and glued together to form a module. It can solve the flatness of these devices and it is convenient to assemble in mass production.

Figure 6:
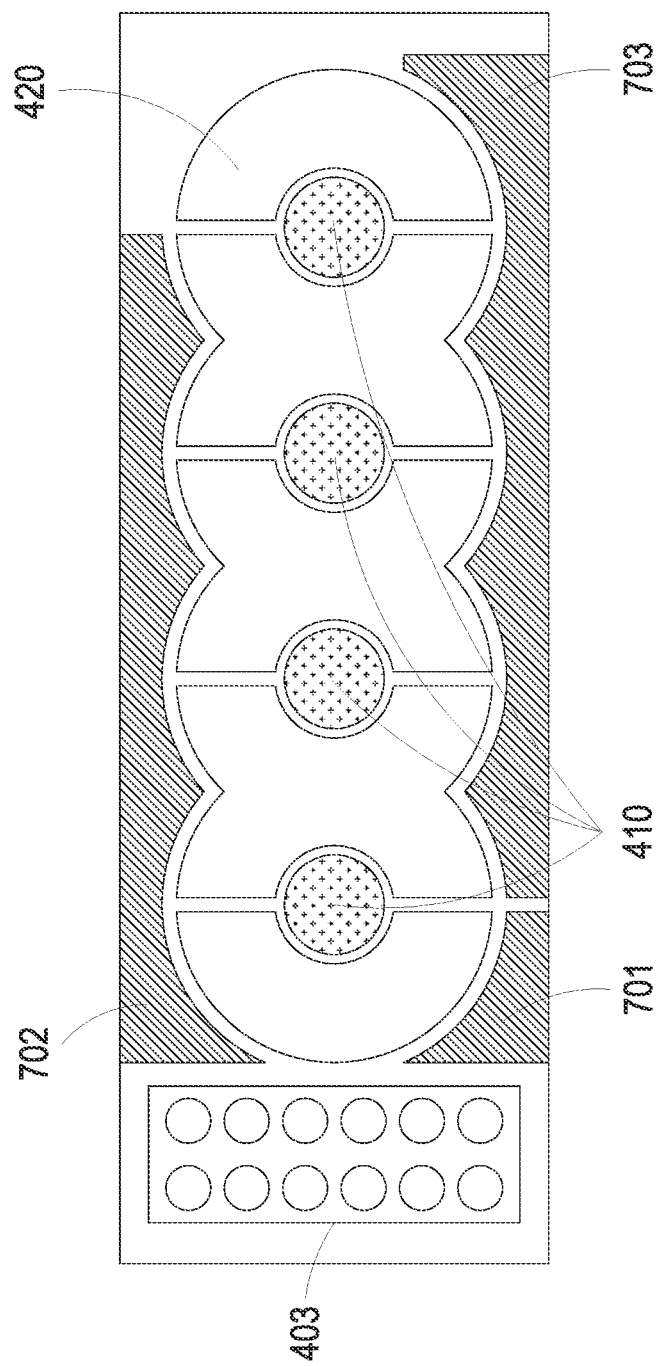
FIG. 6 is a cross-sectional view illustrating the power module of FIG. 2A, wherein the first printed circuit board and the second printed circuit board are omitted from the power module.

FIG. 6 is a cross-sectional view illustrating the power module of FIG. 2A, wherein the first printed circuit board and the second printed circuit board are omitted from the power module. The inner side surfaces of the second electrical conductor 701 and the third electrical conductors 702, 703 are wave-shaped. At least one part of an outer side surface of the magnetic core portion 420 is also wave-shaped to match with the inner side surfaces of the second electrical conductor 701 and the third electrical conductors 702, 703. Therefore, when the magnetic core portion 420 is disposed between the second electrical conductor 701 and the third electrical conductors 702, 703, the second electrical conductor 701 and the third electrical conductors 702, 703 can fit the magnetic core portion 420 tightly. In addition, the second electrical conductor 701 and the third electrical conductors 702, 703 can also share more mechanical pressure coming from the spring screw of assembling heatsink 13 since the inner side surfaces of the second electrical conductor 701 and the third electrical conductors 702, 703 are wave-shaped. Moreover, the outer side surfaces of the second electrical conductor 701 and the third electrical conductors 702, 703 are flat. Furthermore, the second electrical conductor 701 and the third electrical conductors 702, 703 are almost symmetric distribution on the sides of the first electrical conductors 410, and all of the second electrical conductor 701 and the third electrical conductors 702, 703 are stand-offs located between the first printed circuit board 401 and the second printed circuit board 402. Namely, the second electrical conductor 701 and the third electrical conductors 702, 703 plus the first electrical conductors 410 can be served as supporters between the first printed circuit board 401 and the second printed circuit board 402 to share the mechanical pressure coming from the spring screw of assembling heatsink 13.

Figure 7:
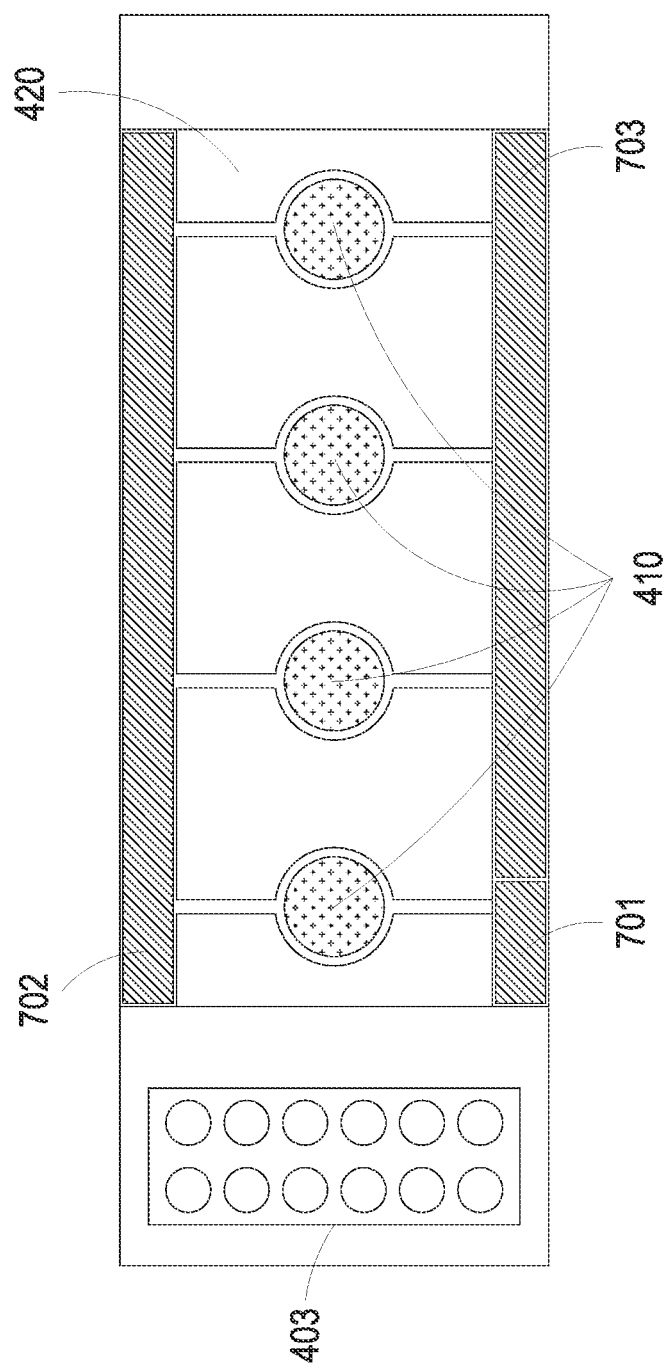
FIG. 7 is a cross-sectional view illustrating a power module according to a second embodiment of the present disclosure, wherein the first printed circuit board and the second printed circuit board are omitted from the power module.

FIG. 7 is a cross-sectional view illustrating a power module according to a second embodiment of the present disclosure, wherein the first printed circuit board and the second printed circuit board are omitted from the power module. In some embodiments, the magnetic core portion 420 is rectangle. Corresponding to the magnetic core portion 420, the second electrical conductor 701 and the third electrical conductors 702, 703 are rectangle whose capability of enduring mechanical pressure is not good as wave-shaped. The other structure features and functions of the magnetic core portion 420 and the electrical conductors 701 to 703 as shown in FIG. 7 are similar to the magnetic core portion 420 and the electrical conductors 701 to 703 as shown in FIG. 6, and are not redundantly described therein. It is noted that the shapes of the magnetic core portion 420 and the electrical conductors 701 to 703 are not limited to the above embodiment, and can be varied according to the practical requirements.

Figure 8:
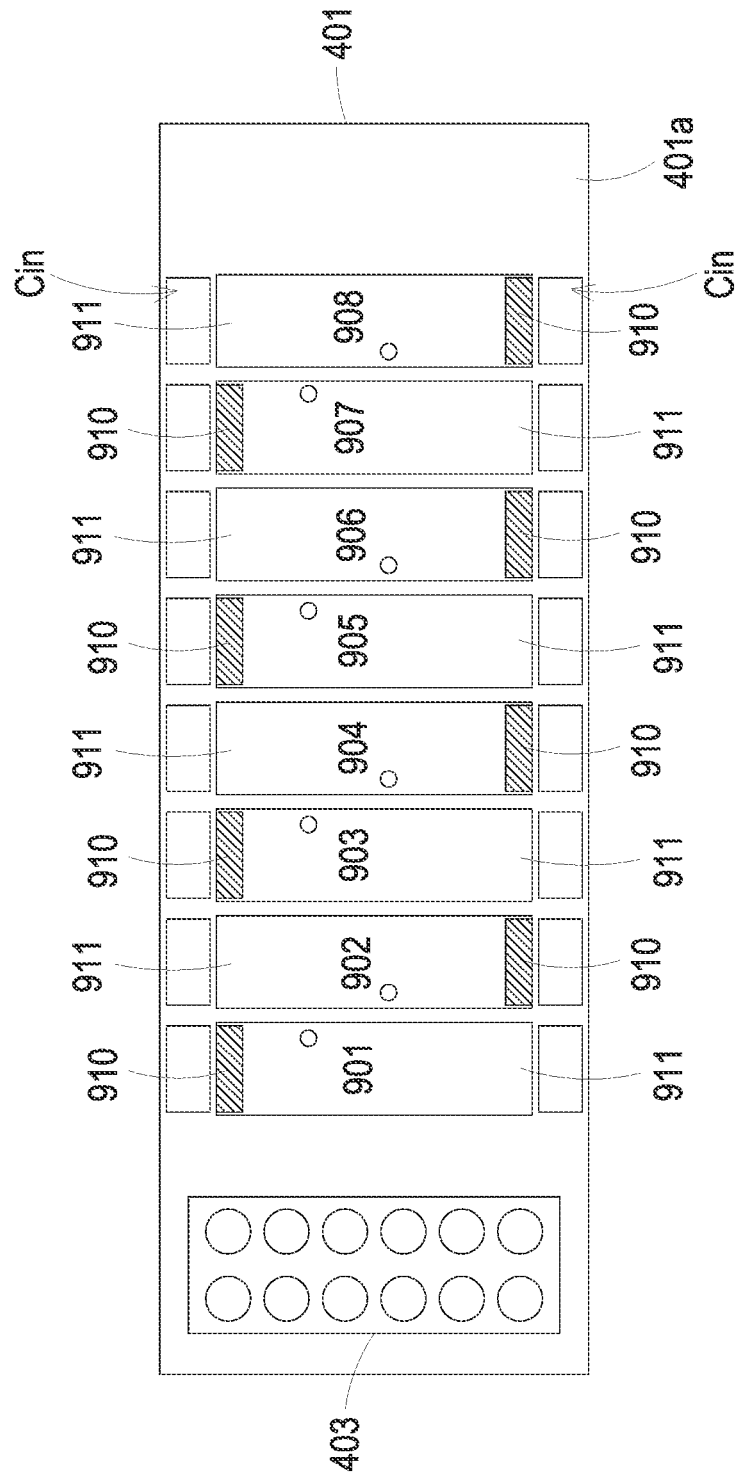
FIG. 8 is a schematic top view illustrating the first surface of the first printed circuit board of the power module of FIG. 2A.

FIG. 8 is a schematic top view illustrating the first surface of the first printed circuit board of the power module of FIG. 2A. As shown in FIGS. 2A, 2B and 8, the first printed circuit board 401 comprises a plurality of soldering areas 901, 902, 903, 904, 905, 906, 907, 908 disposed on the first surface 401a thereof. The eight Dr. MOS elements 10a in the four phase bulk circuits of the power module 2 are soldered on corresponding soldering areas 901 to 908, respectively. When the eight Dr. MOS elements 10a in the four phase bulk circuits of the power module 2 are disposed on the first surface 401a of the first printed circuit board 401, the long sides of all Dr. MOS elements 10a are parallel with a third side and a fourth side (i.e. short sides) of the first printed circuit board 401, wherein the third side and the fourth side are disposed between the first side and the second side (i.e. long sides) of the first printed circuit board 401. In addition, all of the Dr. MOS elements 10a are arranged in one row. It is benefit to save the space of the first printed circuit board 401.

The two Dr. MOS elements 10a disposed on the soldering areas 901, 902 are connected in parallel to form the power circuit 10 in one phase buck circuit. Similarly, the other two Dr. MOS elements 10a disposed on the soldering areas 903, 904, the other two Dr. MOS elements 10a disposed on the soldering areas 905, 906, and the other two Dr. MOS elements 10a disposed on the soldering areas 907, 908 are respectively connected in parallel to form other power circuits 10 in the other phase bulk circuits. Each of the soldering areas 901 to 908 comprises a first terminal area 910 and a second terminal area 911, wherein the second terminals of all Dr. MOS elements 10a are soldered on the respective first terminal areas 910, and the first terminals of all Dr. MOS elements 10a are soldered on the respective second terminal areas 911. Moreover, the positions of the first terminal areas 910 of the soldering areas 902, 904, 906, 908 on the first surface 401a of the first printed circuit board 401 are opposite to the positions of the first terminal areas 910 of the soldering areas 901, 903, 905, 907, and the positions of the second terminal areas 911 of the soldering areas 902, 904, 906, 908 on the first surface 401a of the first printed circuit board 401 are opposite to the positions of the second terminal areas 911 of the soldering areas 901, 903, 905, 907. Therefore, the positions of the first terminals and the second terminals of the Dr. MOS elements 10a on the soldering areas 901, 903, 905, 907 of the first surface 401a of the first printed circuit board 401 are opposite to the first terminals and the second terminals of the other Dr. MOS elements 10a on the soldering areas 902, 904, 906, 908 of the first surface 401a of the first printed circuit board 401. Therefore, the terminals of the two Dr. MOS elements 10a in every phase bulk circuit can be close to the first terminal of the corresponding first electrical conductor 410 together so that the trace of the first terminal SW of each of the output inductors L can be shorter. Moreover, a plurality of input capacitors Cin connected in parallel can be disposed nearby the first terminal of the corresponding Dr. MOS element 10a so as to shorten the input trace of the Dr. MOS element 10a. Consequently, the layout of all Dr. MOS elements 10a shown in FIG. 8 can be compact to achieve the small size and the high-power density of the power module 2. Furthermore, underfill is dispensed between the Dr. MOS elements 10a and the soldering areas 901 to 908 in order to improve the mechanical pressure-resistant ability of the Dr. MOS element's 10a body and the Dr. MOS element's 10a solder joint, which can help to decrease the risk of failure caused by the spring screw of assembling heatsink 13.

In some embodiments, the terminals of the second electrical conductors 701 and the third electrical conductors 702 and 703 soldered on the second surface 401b of the first printed circuit board 401 are electrically connected with the first terminal areas 910 and the second terminal areas 911 on the first surface 401a of the first printed circuit board 401 through the inner traces of the first printed circuit board 401.

Figure 9:
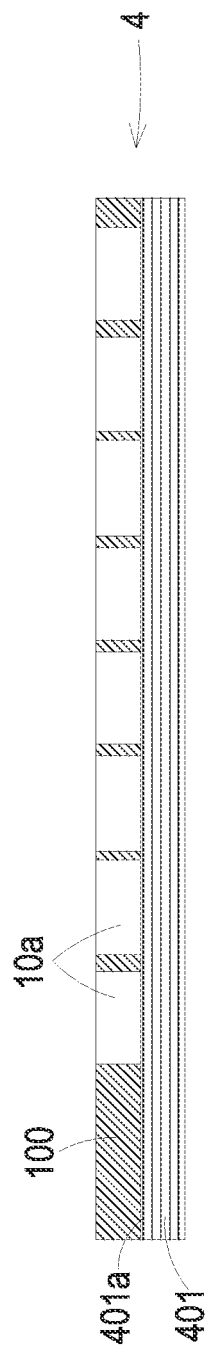
FIG. 9 is a schematic cross-sectional view illustrating a variant example of the first circuit board assembly of FIG. 2A.
Figure 10:
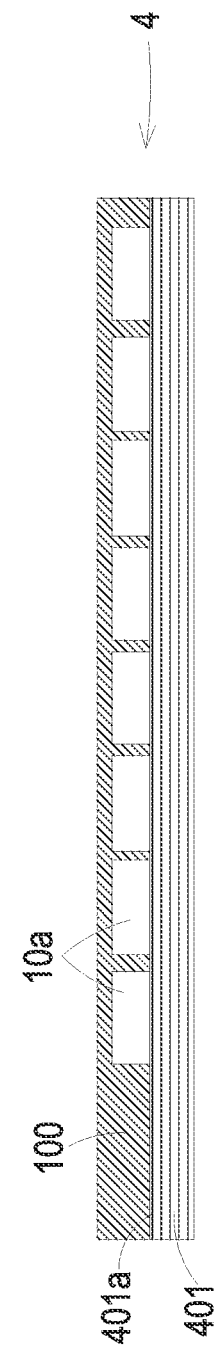
FIG. 10 is a schematic cross-sectional view illustrating another variant example of the first circuit board assembly of FIG. 2A.

FIG. 9 is a schematic cross-sectional view illustrating a variant example of the first circuit board assembly of FIG. 2A. FIG. 10 is a schematic cross-sectional view illustrating another variant example of the first circuit board assembly of FIG. 2A. In some embodiments, the first circuit board assembly 4 further comprises a molding compound layer 100. The first surface 401a of the first printed circuit board 401, the Dr. MOS elements 10a and the at least one input capacitor (not shown in FIGS. 9 and 10) are encapsulated by the molding compound layer 100 through a plastic molding process. An external surface of the molding compound layer 100 is a flat surface. The external surface of the molding compound layer 100 is attached and fixed on the casing or the heatsink 13 of the electronic device. Since the external surface is a flat surface, the contact area between the external surface of the power module 2 and the casing (or the heatsink 13) of the electronic device is increased. The increased contact area is helpful to reduce the thermal resistance, increase the heat dissipating capability of the power module 2, uniformly distribute the pressure from the casing and increase the pressure resistance of the first circuit board assembly 4. As shown in FIG. 9, in order to keep the lowest thermal resistance between the Dr. MOS elements 10a and the heatsink 13 (or the casing of the electronic device), the surfaces of all the eight Dr. MOS elements 10a are exposed on the molding compound layer 100 to form the flat surface of the power module 2. As shown in FIG. 10, all Dr. MOS elements 10a are encapsulated in the molding compound layer 100 so that the surface of the molding compound layer 100 form the flat surface of the power module 2.

Figure 11A:
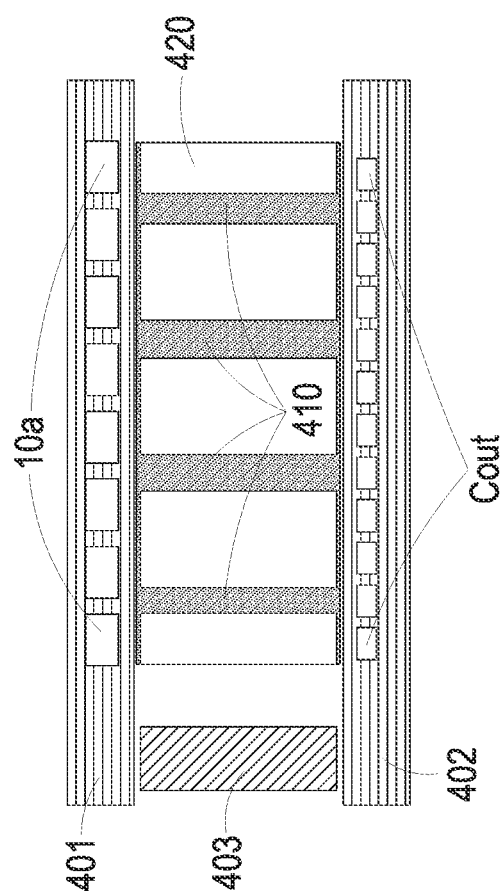
FIG. 11A is a cross-sectional view illustrating the Dr. MOS elements and the input capacitors embedded in the first printed circuit board, and the output capacitors embedded in the second printed circuit board of FIG. 2A, which is taken along the long side of the first printed circuit board.
Figure 11B:
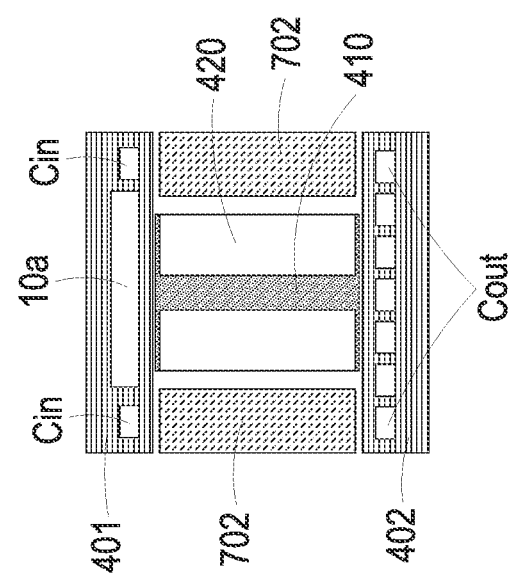
FIG. 11B is another cross-sectional view illustrating the Dr. MOS elements and the input capacitors embedded in the first printed circuit board, and the output capacitors embedded in the second printed circuit board of FIG. 2A, which is taken along the short side of the first printed circuit board.

FIG. 11A is a cross-sectional view illustrating the Dr. MOS elements and the input capacitors embedded in the first printed circuit board, and the output capacitors embedded in the second printed circuit board of FIG. 2A, which is taken along the long side of the first printed circuit board. FIG. 11B is another cross-sectional view illustrating the Dr. MOS elements and the input capacitors embedded in the first printed circuit board, and the output capacitors embedded in the second printed circuit board of FIG. 2A, which is taken along the short side of the first printed circuit board. As shown in FIGS. 11A and 11B, in some embodiments, the Dr. MOS elements 10a and the input capacitors Cin are embedded in the first printed circuit board 401. Consequently, the external surface of the power module 2 is a flat surface, and the contact area between the external surface of the power module 2 and the casing (or the heatsink 13) of the electronic device is increased. It is benefit to attach the heatsink 13 with the external surface of the power module 2 easily. In addition, the increased contact area is helpful to reduce the thermal resistance between the casing of the electronic device (or heatsink 13) and the Dr. MOS elements 10a, increase the heat dissipating capability of the power module 2, uniformly distribute the pressure from the casing (or from the spring screw of heatsink 13) and increase the pressure resistance of the first circuit board assembly 4. In other embodiment, the output capacitors Cout are embedded into the second printed circuit board 402. By this way, all soldering pads for the electrical conductors and all the output capacitors Cout are distributed in different layers. As a result, most portion of the second surface 402b of the second printed circuit board 402 are retained to be the soldering pads for the first electrical conductors 401, the second electrical conductor 701, the third electrical conductors 702, 703, and the signal communication part 403. Consequently, more space can be accessed to settle more output capacitors Cout into the whole area of the second printed circuit board 402 so as to meet the load dynamic switching requirements of the electronic device. In other embodiments, some or all of the electronic components in all power circuits 10 of the power module 2 are embedded into the first printed circuit board 401 and the second printed circuit board 402 except for the output inductors L, the signal communication part 403, the second electrical conductor 701 and the third electrical conductors 702, 703. Less exposed devices are benefit to decrease the process of mass production. Based on the technology of embedding, the power module 2 is easier to be assembled to the system board 9.

Figure 11C:
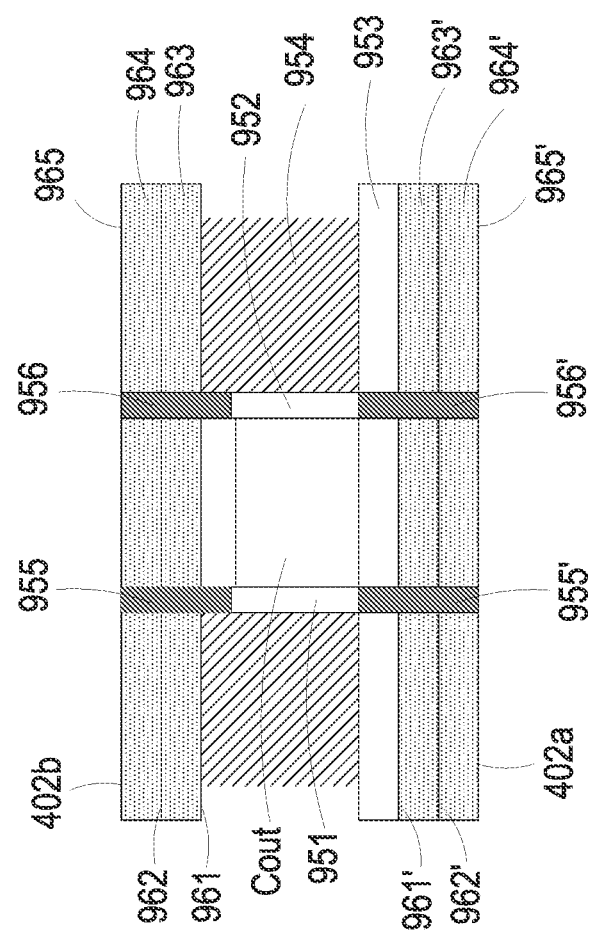
FIG. 11C is a schematic cross-sectional view illustrating an example of embedding the output capacitor in the second printed circuit board according to the first embodiment of the present disclosure.

FIG. 11C is a schematic cross-sectional view illustrating an example of embedding the output capacitor in the second printed circuit board according to the first embodiment of the present disclosure. For succinctness, only one output capacitor Cout embedded in the second printed circuit board 402 is shown in FIG. 11C. The second printed circuit board 402 includes a substrate 953, an interface layer 954, a plurality of first electroplating layers 961, 961', a plurality of second electroplating layers 962, 962', a plurality of first insulation layers 963, 963', a plurality of second insulation layers 964, 964' and a plurality of third electroplating layers 965, 965'.

The output capacitor Cout has two electrodes 951 and 952 and the output capacitor Cout is mounted on a first surface of the substrate 953. The two electrodes 951 and 952 of the output capacitor Cout are soldered on the substrate 953 of the second printed circuit board 402. The interface layer 954 is made of AjinomotoBuild-up Film (ABF). The interface layer 954 is formed over the first surface of the substrate 953 and the output capacitor Cout. After the interface layer 954 is baked at a specified temperature (e.g., 180° C.) for a specified time period (e.g., 30 minutes), the interface layer 954 is solidified into an insulation layer.

The first electroplating layers 961, 961' are copper layers that are laminated and electroplated on a top surface of the interface layer 954 and a second surface of the substrate 953, respectively. The thickness of the first electroplating layer 961, 961' is about 30Z. Moreover, two plated through holes are formed in the interface layer 954, and two plated through holes are formed in the substrate 953. The two plated through holes of the interface layer 954 and the two plated through holes of the substrate 953 are aligned with the two electrodes 951 and 952 of the output capacitor Cout, respectively. Moreover, the two plated through holes of the interface layer 954 and the two plated through holes of the substrate 953 are connected with each other through the two electrodes 951 and 952 of the output capacitor Cout.

The first insulation layers 963, 963' are formed on a top surface of the first electroplating layer 961 and a bottom surface of the first electroplating layer 961', respectively.

The second electroplating layers 962 and 962' are copper layers that are laminated and electroplated on a top surface of the first insulation layer 963 and a bottom surface of the first insulation layer 963', respectively. The thicknesses of the second electroplating layers 962, 962' are about 30Z. Moreover, two plated through holes are formed in the first insulation layer 963, and two plated through holes are formed in the first insulation layer 963'. The two plated through holes of the first insulation layer 963 are aligned and contacted with the two plated through holes of the interface layer 954 so that the two plated through holes of the first insulation layer 963 are connected with the two electrodes 951, 952 of the output capacitor Cout. The two plated through holes of the first insulation layer 963' are aligned and contacted with the two plated through holes of the substrate 953 so that the two plated through holes of the first insulation layer 963' are connected with the two electrodes 951, 952 of the output capacitor Cout.

The second insulation layers 964 and 964' are formed on a top surface of the second electroplating layer 962 and a bottom surface of the second electroplating layer 962', respectively. The third electroplating layers 965, 965' (i.e. cooper layers) are laminated and electroplated on a top surface of the second insulation layer 964 and a bottom surface of the second insulation layer 964', respectively, so as to form a second surface 402b and a first surface 402a of the second printed circuit board 402. The thicknesses of the third electroplating layers 964, 964' are about 30Z. Moreover, two plated through holes are formed in the second insulation layer 964, and two plated through holes are formed in the second insulation layer 964'. The two plated through holes of the second insulation layer 964 are aligned and contacted with the two plated through holes of the first insulation layer 963 so that the two plated through holes of the second insulation layer 964 are connected with the two plated through holes of the first insulation layer 963, the two plated through holes of the interface layer 954 and the two electrodes 951, 952 of the output capacitor Cout. The two plated through holes of the second insulation layer 964' are aligned and contacted with the two plated through holes of the first insulation layer 963' so that the two plated through holes of the second insulation layer 964' are connected with the two plated through holes of the first insulation layer 963', the two plated through holes of the substrate 953 and the two electrodes 951, 952 of the output capacitor Cout.

In the upper half and left side of the second printed circuit board assembly 402, one of the plated through holes of the second insulation layer 964, one of the plated through holes of the first insulation layer 963 and one of the plated through holes of the interface layer 954 are collaboratively defined as a first conducting line 955. In the lower half and left side of the second printed circuit board assembly 402, one of the plated through holes of the second insulation layer 964', one of the plated through holes of the first insulation layer 963' and one of the plated through holes of the substrate 953 are collaboratively defined as a first conducting line 955'. In the upper half and right side of the second printed circuit board assembly 402, the other one of the plated through holes of the second insulation layer 964, the other one of the plated through holes of the first insulation layer 963 and the other one of the plated through holes of the interface layer 954 are collaboratively defined as a second conducting line 956. In the lower half and right side of the second printed circuit board assembly 402, the other one of the plated through holes of the second insulation layer 964', the other one of the plated through holes of the first insulation layer 963' and the other one of the plated through holes of the substrate 953 are collaboratively defined as a second conducting line 956'. Namely, the plated through holes of the above layers in the left side are collaboratively defined as a first conducting line. The plated through holes of the above layers in the right side are collaboratively defined as a second conducting line. The first conducting line 955, 955' is electrically connected with the first terminal of the output capacitor Cout and the positive output terminal Vo+ of the power module 2. The second conducting line 956, 956' is connected with the second terminal of the output capacitor Cout and the negative output terminal Vo− of the power module 2. Since the output capacitors Cout are embedded in the second printed circuit board 402, the power module 2 can be equipped with more output capacitors Cout. In addition, the output capacitors Cout are not interfered by other components of the second printed circuit board 402. In an embodiment, the through holes are formed by laser drilling process.

Figure 12A:
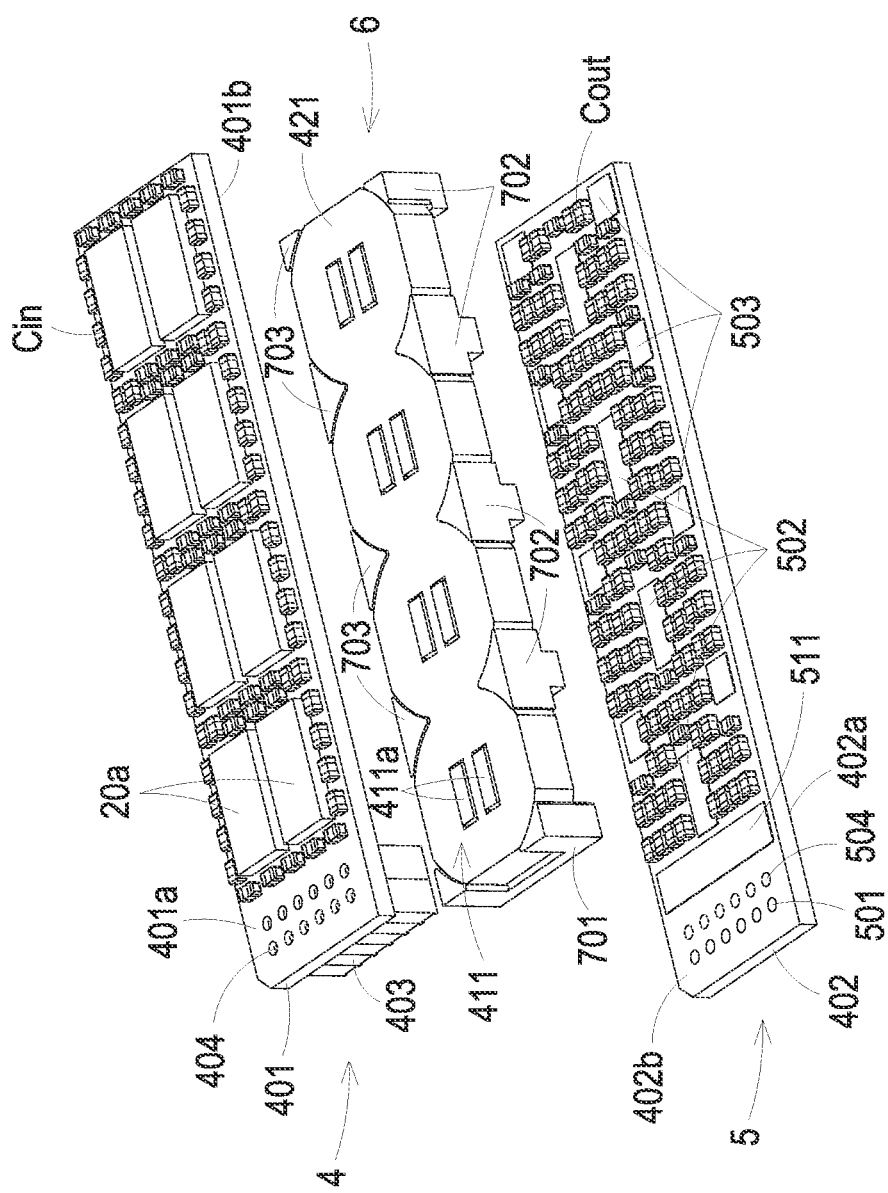
FIG. 12A is a schematic exploded view illustrating a power module according to a third embodiment of the present disclosure and taken along a viewpoint.
Figure 12B:
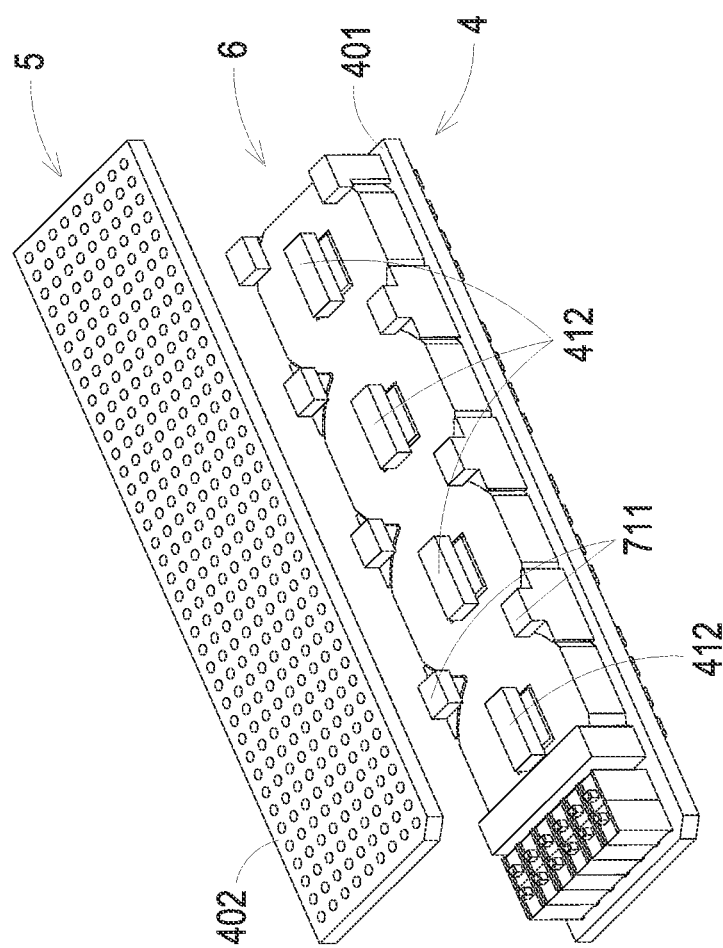
FIG. 12B is a schematic exploded view illustrating the power module of FIG. 12A and taken along another viewpoint.
Figure 13:
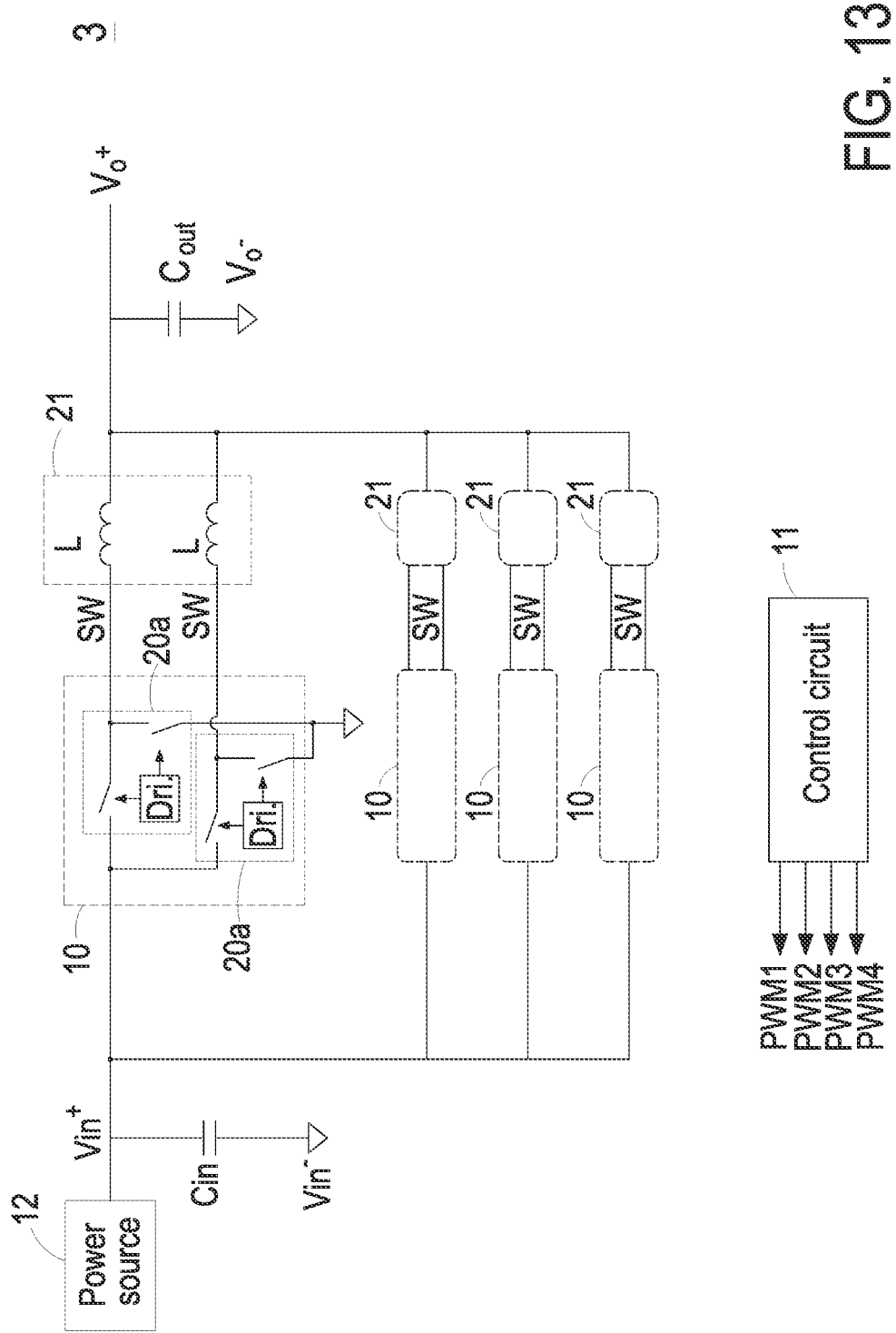
FIG. 13 is a schematic equivalent circuit diagram illustrating the power module of FIG. 12A.

Please refer to FIGS. 12A, 12B and 13. FIG. 12A is a schematic exploded view illustrating a power module according to a third embodiment of the present disclosure and taken along a viewpoint. FIG. 12B is a schematic exploded view illustrating the power module of FIG. 12A and taken along another viewpoint. FIG. 13 is a schematic equivalent circuit diagram illustrating the power module of FIG. 12A. Component parts and elements corresponding to those of the first embodiment are designated by identical numeral references, and detailed descriptions thereof are omitted. In this embodiment, the power module 3 is served as a voltage regulator module (VRM) and is applied in an electronic device 1 (referring to FIG. 4). The power module 3 is a multi-phase buck converter, for example but not limited to 4-phase buck converter.

The power module 3 comprises a plurality of power circuits 10, a plurality of output inductor assemblies 21, a control circuit 11 and at least one output capacitor Cout. As shown in FIG. 13, each power circuit 10 and the corresponding output inductor assembly 21 are electrically connected with each other in series to define a phase buck circuit. In this embodiment, the power module 2 comprises four phase buck circuits, i.e. the first phase buck circuit to the fourth phase buck circuit from top to bottom. The four phase buck circuits are electrically connected with each other in parallel and electrically connected between a power source 12 and a first terminal of the output capacitor Cout. In addition, each of the power circuits 10 comprises at least two switch circuits, for example two Dr. MOS elements 20a, which are connected in parallel. Each of the Dr. MOS elements 20a comprises at least one switch and a driver which is used to drive the at least one switch. Preferably but not exclusively, the Dr. MOS element 20a comprises two switches and one driver. Each of the output inductor assemblies 21 comprises two output inductors L. The two Dr. MOS elements 20a of the power circuit 10 are in series with the output inductors L of the corresponding output inductor assembly 21 respectively to form two series circuits which are connected in parallel. The two series circuits which are connected in parallel form one phase buck circuit. In this embodiment, the power module 3 comprises four phase buck circuits so that the power module 3 comprises eight Dr. MOS elements 20a and eight output inductors L. The input side of the power module 3 comprises a positive input terminal Vin+ and a negative input terminal Vin−. The output side of the power module 3 comprises a positive output terminal Vo+ and a negative output terminal Vo−. The negative input terminal Vin− and the negative output terminal Vo− are electrically connected with a common terminal. Each of the Dr. MOS elements 20a further comprises a first terminal connected with the positive input terminal Vin+ of the power module 3, a second terminal connected with a ground (i.e. the negative output terminal Vo− of the power module 3) and a third terminal connected with a first terminal SW of the corresponding output inductor L. In each phase buck circuit, the two Dr. MOS elements 20a can increase the maximum output power and decrease the conduction loss of the switches.

Moreover, the output inductors L in every phase are independent, and the output inductors L in every phase are independent with the output inductors L in other phases. The first terminal of the output capacitor Cout is electrically connected with the positive output terminal Vo+ of the power module 3, and a second terminal of the output capacitor Cout is electrically connected with the negative output terminal Vo− (i.e., ground) of the power module 3. In some embodiments, the power module 3 further comprises at least one input capacitor Cin. A first terminal of the input capacitor Cin is electrically connected with the positive input terminal Vin+ of the power module 3. A second terminal of the input capacitor Cin is electrically connected with the negative input terminal Vin− of the power module 3. By this way, the ripple current of the input capacitors Cin and the output capacitors Cout are minimized, and the numbers and the size of the input capacitor Cin and the output capacitor Cout can also be minimized.

In this embodiment, the control circuit 11 senses the output voltage of the power module 3 and the output current of each phase buck circuit and generates four pulse width modulation signals PWM1, PWM2, PWM3 and PWM4 accordingly so as to control the power circuit 10 in each phase buck circuit. Since the power module 3 comprises four phases, the phase difference between every two adjacent pulse width modulation signals is 90 degrees. Each phase buck circuit is controlled by the control circuit 11 according to one pulse width modulation signal. For example, the first phase buck circuit is controlled according to the first pulse width modulation signal PWM1, the second phase buck circuit is controlled according to the second pulse width modulation signal PWM2, the third phase buck circuit is controlled according to the third pulse width modulation signal PWM3, and the fourth phase buck circuit is controlled according to the fourth pulse width modulation signal PWM4.

As shown in FIGS. 12A and 12B, the power module 3 comprises a first circuit board assembly 4, a second circuit board assembly 5 and a magnetic core assembly 6. The first circuit board assembly 4 comprises a first printed circuit board 401, at least one input capacitor Cin and a plurality of power circuits 10. Each power circuit comprises two switch circuits. Each switch circuit comprises a Dr. MOS element 20a. In this embodiment, the plurality of Dr. MOS elements 20a and the at least one input capacitor Cin are mounted on a first surface 401a of the first printed circuit board 401 by a welding process or through a conductive adhesive. In this embodiment, the eight Dr. MOS elements 20a are arranged in two rows. The input capacitors Cin are distributed around the Dr. MOS elements 20a. The first printed circuit board 401 with the Dr. MOS elements 20a may be in contact with a heatsink 13 (referring to FIG. 4) or a casing of the electronic device so that the heat generated from the power module 3 can be conducted to the heatsink 13 or the casing of the electronic device by the first printed circuit board 401. The operations of the power circuits 10 cause the main portion of heat of the power module 3, and the power circuits 10 are in contact with the heatsink 13 or the casing of the electronic device so that the heat from the power circuits 10 can be conducted to the heatsink 13 or the casing of the electronic device directly. In such way, the thermal resistance is reduced, and the heat dissipating efficacy is enhanced.

Please refer to FIGS. 12A and 12B again. The magnetic core assembly 6 is arranged adjacent to the first circuit board assembly 4. In this embodiment, the magnetic core assembly 6 is disposed between the first circuit board assembly 4 and the second circuit board assembly 5 and arranged beside a second surface 401b of the first printed circuit board 401. The magnetic core assembly 6 comprises a magnetic core portion 421 and a plurality of electrical conductor assemblies 411. Each electrical conductor assembly 411 comprises a plurality of first electrical conductors 411a. Preferably, each electrical conductor assembly 411 comprises two first electrical conductors 411a. Each of the first electrical conductors 411a is penetrated through the magnetic core portion 421. Consequently, an output inductor L is defined by the magnetic core portion 421 and the first electrical conductor 411a. In this embodiment, the power module 3 comprises four phase buck circuits. This is, the power module 3 includes eight output inductors L. As shown in FIGS. 12A and 12B, the magnetic core assembly 6 comprises eight first electrical conductors 411a. The eight first electrical conductors 411a are correlated to the eight windings of the eight output inductors L. The number of the first electrical conductors 411a corresponds to the number of the output inductors L shown in FIG. 13. Preferably but not exclusively, the power module 3 comprises eight first electrical conductors 411a disposed between the second surface 401b of the first printed circuit board 401 and the second surface 402b of the second printed circuit board 402 of the second circuit board assembly 5 and are arranged in two rows. A first terminal of each of the first electrical conductors 411a, which forms the first terminal SW of a corresponding output inductor L, is soldered on the second surface 401a of the first printed circuit board 401. A second terminal of each of the first electrical conductors 411a, which forms the second terminal of a corresponding output inductor L and is electrically connected to the positive output terminal Vo+ of the power module 3, is soldered on the second surface 402b of the second printed circuit board 402. In some embodiments, the second terminals of each two adjacent first electrical conductors 411a are connected and shaped to a common bump 412, which is electrically connected to the positive output terminal Vo+ of the power module 3. The common bumps 412 are soldered on the second surface 402b of the second printed circuit board 402 so that more space can be released for allowing more output capacitors Cout to be disposed on the second surface 402b of the second printed circuit board 402.

Figure 14:
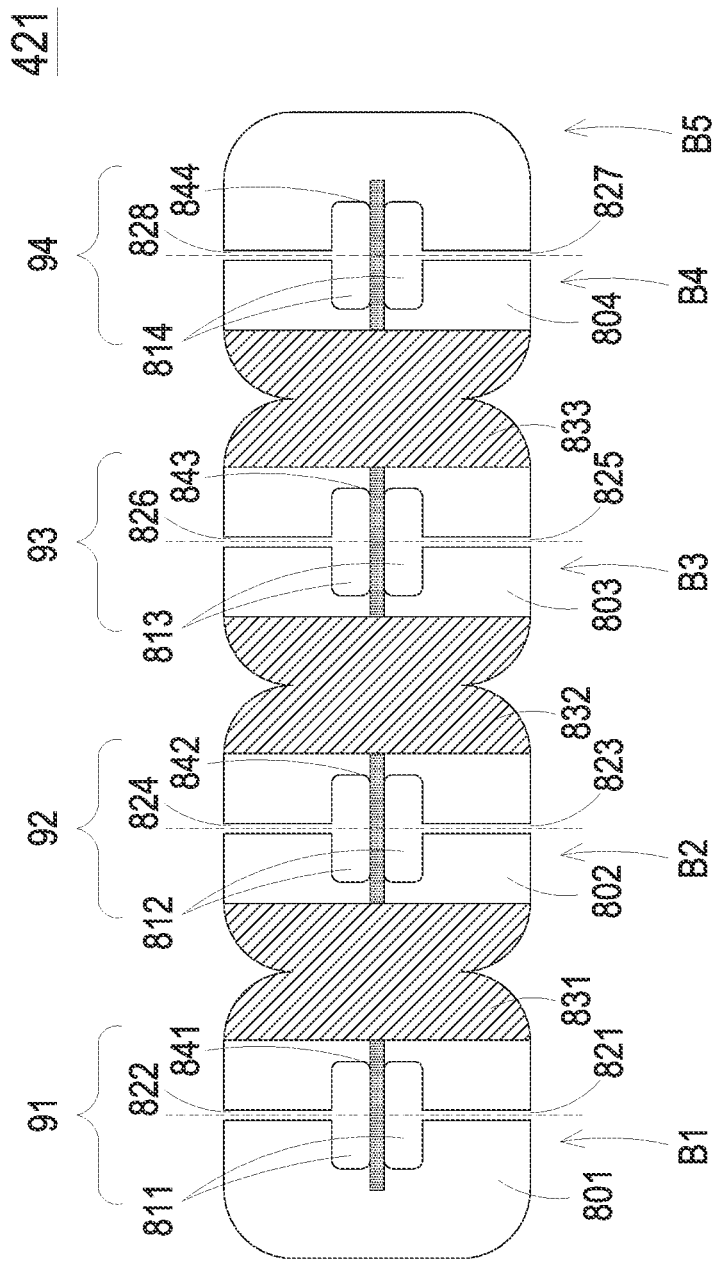
FIG. 14 is a schematic cross-sectional view illustrating the magnetic core portion of the magnetic core assembly of the power module of FIG. 12A.

FIG. 14 is a schematic cross-sectional view illustrating the magnetic core portion of the magnetic core assembly of the power module of FIG. 12A. The magnetic core portion 421 includes a plurality of core units 91, 92, 93, 94, which are connected with each other. Preferably but not exclusively, the magnetic core portion 421 comprises four core units 91, 92, 93 and 94. It is noted that the number of the core unit is not limited to four and can be varied according to the practical requirements. For example, the number of the core unit is one. Each of the core units 91, 92, 93 and 94 is a square core with four rounded corners. The magnetic core portion 421 further comprises a plurality of holes 811, 812, 813, 814, wherein the number of the holes 811, 812, 813, 814 corresponds to the number of the first electrical conductors 411a. Two parallel holes 811 are formed in a middle region of the core unit 91. Two parallel holes 812 are formed in a middle region of the core unit 92. Two parallel holes 813 are formed in a middle region of the core unit 93. Two parallel holes 814 are formed in a middle region of the core unit 94. Preferably but not exclusively, the holes 811, 812, 813, 814 are square-shaped. Each of the holes 811, 812, 813, 814 is aligned in position with the corresponding first electrical conductor 411a. The sizes and shapes of the holes 811, 812, 813, 814 match the sizes and shapes of the cross-sectional areas of the first electrical conductors 411a, respectively. The first electrical conductors 411a are respectively penetrated through the holes 811, 812, 813, 814 to define eight output inductors L. For example, the two first electrical conductors 411a of the electrical conductor assembly 411 are penetrated through the holes 811, respectively. Consequently, the output inductors L of the first phase buck circuit are defined by the two first electrical conductors 411a and the core unit 91 collaboratively. The rest may be deduced by analogy. In this embodiment, since the first electrical conductor 411a has good supporting property and thermal conductivity, the first electrical conductor 411a can be arranged between the first circuit board assembly 4 and the second circuit board assembly 5 to support the first circuit board assembly 4 and the second circuit board assembly 5. Consequently, the capability of the power module 3 to withstand the pressure from the casing of the electronic device will be enhanced. Due to the good thermal conductivity of copper, the heat from the output inductors L can be transferred rapidly and effectively. Consequently, the thermal resistance in the thermal conduction path is decreased. Due to low resistivity of copper, the conduction resistance of the output inductor L is decreased. Consequently, the conduction loss of the output inductor L is decreased, and the conversion efficiency of the power module 3 is increased.

Please refer to FIGS. 12A, 12B and 13 again. The second circuit board assembly 5 comprises a second printed circuit board 402 and at least one output capacitor Cout. Preferably, the second circuit board assembly 5 comprises a plurality of output capacitors Cout. The second printed circuit board 402 has a first surface 402a and a second surface 402b. The first surface 402a is opposite to the second surface 402b. The second surface 402b of the second printed circuit board 402 is arranged beside the magnetic core assembly 6. In some embodiments, the plurality of output capacitors Cout are disposed on the second surface 402b of the second printed circuit board 402. In some other embodiments, the output capacitors Cout are embedded within the second printed circuit board 402. The second circuit board assembly 5 further comprises a plurality of ball grid arrays. The ball grid arrays are disposed on the first surface 402a of the second printed circuit board 402. The ball grid arrays are electrically connected with the ball grid arrays of the central processing unit on the system board. Preferably, the gaps and networks of the ball grid arrays on the first surface 402a of the second printed circuit board 402 correspond to those of the ball grid arrays on the system board.

From the above descriptions, since the power module 3 of the present disclosure use the first electrical conductors 411a as the windings of the output inductors L, the power module 3 can reduce the direct current resistances (DCRs) of windings of the output inductors L and reduce the power loss of the output inductors L. In addition, since the first electrical conductors 411a comprise good thermal conductivity and shorter length, the thermal resistance between the power circuits 10 and the system board 9 is reduced by the first electrical conductors 411a so as to benefit the heat dissipation of the power circuits 10. At the same time, suitable inductance can be obtained according to the lengths of the first electrical conductors 411a and the cross-sectional area of the magnetic core portion 421.

In some embodiment, as shown in FIGS. 12A and 12B, the power module 3 further comprises at least one second electrical conductor 701 and a plurality of third electrical conductors 702, 703. The second electrical conductor 701 is soldered between the second surface 401b of the first printed circuit board 401 and the second surface 402b of the second printed circuit board 402, and the second electrical conductor 701 is located at a first side of the power module 3 and forms the positive input terminal of the power module 3. The third electrical conductor 702 is soldered between the second surface 401b of the first printed circuit board 401 and the second surface 402b of the second printed circuit board 402, and located at the first side of the power module 3. The first side of the power module 3 is the long side of the power module 3. In addition, the third electrical conductor 702 is close to the second electrical conductor 701. The third electrical conductor 703 is soldered between the second surface 401b of the first printed circuit board 401 and the second surface 402b of the second printed circuit board 402, and located at a second side of the power module 3, wherein the second side is opposite to the first side. Moreover, the third electrical conductors 702, 703 form a negative output terminal Vo− of the power module 3. Since the power module 3 of the present disclosure employs the second electrical conductor 701 as the positive input terminal Vin+ of the power module 3 and employs the third electrical conductors 702, 703 as the negative output terminal Vo− of the power module 3, the DCR of the positive input terminal Vin+ and the negative output terminal Vo− of the power module 3 can be reduced. Moreover, since the second electrical conductor 701 and the third electrical conductors 702, 703 comprise good thermal conductivity, respectively, the thermal resistance between the power circuits 10 and the system board is decreased further so as to benefit the heat dissipation of the power circuits 10 further.

In other embodiment, as shown in FIGS. 12A and 12B, the power module 3 further comprises a signal communication part 403. The signal communication part 403 is soldered between the second surface 401b of the first printed circuit board 401 and the second surface 402b of the second printed circuit board 402. The signal communication part 403 comprises a plurality of pins. The plurality of pins are divided into a first pin group and a second pin group. The first printed circuit board 401 comprises a plurality of through-holes 404. The second printed circuit board 402 comprises a plurality of through-holes 501 and a plurality of blind holes 504. The first terminals of all pins are fixed in the corresponding through-holes 404 of the first printed circuit board 401 by welding. The second terminals of the pins in the first pin group are fixed in the corresponding through-holes 501 of the second printed circuit board 402 by welding. The second terminals of the pins in the second pin group are fixed in the corresponding blind holes 504 of the second printed circuit board 402 by welding. The signal communication part 403 can transmit signals from the first printed circuit board 401 to the second printed circuit board 402 and transmit signals from the second printed circuit board 402 to the first printed circuit board 401. The use of the through-holes 404, 501 are helpful for fixing the position of the signal communication part 403. Due to the blind-holes 504, the first surface 402a of the second printed circuit board 402 is retained to mount more ball grid arrays and an inner space of the second printed circuit board 402 is retained to place more electronic components (i.e. output capacitors Cout). Consequently, the power module 3 can meet the high-power density requirements.

In some embodiments, as shown in FIGS. 12A and 12B, the second printed circuit board 402 comprises a plurality of first soldering pads 502, at least one second solder pad 511 and a plurality of third soldering pads 503. The plurality of first soldering pads 502, the at least one second soldering pad 511 and the plurality of third soldering pads 503 are disposed on the second surface 402b of the second printed circuit board 402. The second surface 402b of the second printed circuit board 402 is arranged beside the magnetic core assembly 6. The plurality of first soldering pads 502 are rectangle pads. The common bump 412 of each electrical conductor assembly 411 is soldered on the corresponding first soldering pad 502 of the second printed circuit board 402. In some embodiments, the second soldering pad 511 is electrically connected with the positive input terminal Vin+ of the power module 3. The third soldering pads 503 are electrically connected with the negative output terminal Vo− of the power module 3. The first soldering pads 502 are electrically connected with the positive output terminal Vo+ of the power module 3. The plurality of ball grid arrays are disposed on the first surface 402a of the second printed circuit board 402. The ball grid arrays are electrically connected with the ball grid arrays of the central processing unit on the system board of the electronic device. Preferably, the gaps and networks of the ball grid arrays on the first surface 402a of the second printed circuit board 402 correspond to those of the ball grid arrays on the system board. The ball grid arrays are electrically connected with the plurality of soldering pads on the second surface 402b of the second printed circuit board 402 through the internal traces of the second printed circuit board 402.

In some embodiments, each of the second electrical conductor 701 and the third electrical conductors 702, 703 comprises at least one bump 711. Preferably, the second electrical conductor 701 and the third electrical conductors 702, 703 comprise a plurality of bumps 711. The bumps 711 are protruded out from the bottom parts of the corresponding second electrical conductor 701 and the third electrical conductors 702, 703, respectively. In addition, the second printed circuit board 402 comprises at least one second soldering pad 511 and a plurality of third soldering pads 503 disposed on the second surface 402b thereof. Preferably, the second soldering pad 511 and the third soldering pads 503 are rectangle pads. The bump 711 of the second electrical conductor 701 is soldered on the second soldering pad 511, and the bumps 711 of the third electrical conductors 702, 703 are soldered on the corresponding third soldering pads 503, respectively. Moreover, when the bump 711 of the second electrical conductor 701 is soldered on the second soldering pad 511 and the bumps 711 of the third electrical conductors 702, 703 are soldered on the corresponding third soldering pads 503, a plurality of receiving spaces are formed between the bottom parts of the second electrical conductor 701, the third electrical conductors 702, 703 and the second printed circuit board 402 so that more output capacitors Cout or other electronic components can be disposed on the second printed circuit board 402 and accommodated in the receiving spaces.

Please refer to FIG. 14 again. The magnetic core portion 421 comprises core units 91, 92, 93, 94 and eight holes 811, 812, 813, 814. Each of the core unit 91, 92, 93, 94 comprises a rectangle 801, 802, 803, 804. The core unit 91 comprises a rectangle 801, the core unit 92 comprises a rectangle 802 crossing with the rectangle 801, the core unit 93 comprises a rectangle 803 crossing with the rectangle 802, and the core unit 94 comprises a rectangle 804 crossing with the rectangle 803. The holes 811 are formed in the middle region of the rectangle 801, the holes 812 are formed in the middle region of the rectangle 802, the holes 813 are formed in the middle region of the rectangle 803, and the holes 814 are formed in the middle region of the rectangle 804. In the magnetic core portion 421, the magnetic field lines of every two adjacent core units 91, 92, 93, 94 (i.e. the rectangles 801, 802, 803, 804) are overlapped to create a first magnetic overlapping region. For example, three first magnetic overlapping regions 831, 832 and 833 indicated by oblique lines are shown in FIG. 14. In each core unit 91, 92, 93, 94, the magnetic field lines of every two output inductors are overlapped to create a second magnetic overlapping region. For example, four second magnetic overlapping regions 841, 842, 843 and 844 are shown in FIG. 14. Each second magnetic overlapping region is arranged between the two holes of the corresponding core unit. In the three first magnetic overlapping regions 831, 832 and 833, the DC magnetic fluxes are balanced out and the AC magnetic fluxes are superposed. In the four second magnetic overlapping regions 841, 842, 843 and 844, the DC magnetic fluxes are balanced out and the AC magnetic fluxes are balanced out. However, since the device parameters and the parasitic parameters of the phase buck circuits corresponding to the pulse width modulation signal are not always identical. Consequently, the DC magnetic fluxes and the AC magnetic fluxes in the four second magnetic overlapping regions 841, 842, 843 and 844 cannot be completely balanced out. That is, a small amount of DC magnetic flux and a small amount of AC magnetic flux are retained. In some embodiments, the area of each first magnetic overlapping region (e.g., 831, 832 or 833) is smaller than two times the area of the non-magnetic overlapping region of each core unit, and the area of each second magnetic overlapping region (841, 842, 843 or 844) is smaller than a half area of the area of the non-magnetic overlapping region of each core unit. The overlapping regions of FIG. 14 are presented herein for purpose of illustration and description only.

Each of the core units 91, 92, 93 and 94 includes two air gaps. The core unit 91 includes the two air gaps 821 and 822, which are symmetrically arranged at two opposite sides of the holes 811. The core unit 92 includes the two air gaps 823 and 824, which are symmetrically arranged at two opposite sides of the holes 812. The core unit 93 includes the two air gaps 825 and 826, which are symmetrically arranged at two opposite sides of the holes 813. The core unit 94 includes the two air gaps 827 and 828, which are symmetrically arranged at two opposite sides of the holes 814. These air gaps can withstand the magnetic pressure averagely. Preferably, the magnetic core portion 421 is an integral structure. Moreover, the combination of the magnetic core portion 421 and the first electrical conductors 411a is installed between the first circuit board assembly 4 and the second circuit board assembly 5.

All air gaps 821 to 828 of the core units 91, 92, 93, 94 are located at the corresponding no-overlapping regions. Moreover, depending on the different specification of the power module 3, each core unit 91 to 94 also can comprises single air gap.

Besides, the air gaps 821 to 828 can separate the magnetic core portion 421 into five parts B1, B2, B3, B4, B5. The five parts B1, B2, B3, B4, B5 are adhered or assembled together by dielectric materials and the air gaps 821 to 828 are formed at the same time, wherein the dielectric materials may be a material with low magnetic permeability.

In some embodiments, the magnetic core portion 421 may be assembled with the first electrical conductors 411a to form eight output inductors L firstly, and then the heat generated by the magnetic core portion 421 can be conducted to the first electrical conductors 411a effectively and the eight output inductors L can be convenient to assemble with the first printed circuit board 401 and the second printed circuit board 402. In some embodiments, the magnetic core portion 421, the first electrical conductors 411a, the second electrical conductor 701, the third electrical conductors 702 and 703 and the signal combination part 403 are assembled and glued together to form a module. It can solve the flatness of these devices and it is convenient to assemble in mass production.

In some embodiment, as shown in FIGS. 12A and 12B, the inner side surfaces of the second electrical conductor 701 and the third electrical conductors 702, 703 are wave-shaped. At least one part of an outer side surface of the magnetic core portion 421 is also wave-shaped to match with the inner side surfaces of the second electrical conductor 701 and the third electrical conductors 702, 703. Therefore, when the magnetic core portion 421 is disposed between the second electrical conductor 701 and the third electrical conductors 702, 703, the second electrical conductor 701 and the third electrical conductors 702, 703 can fit the magnetic core portion 421 tightly. In addition, the second electrical conductor 701 and the third electrical conductors 702, 703 can also share more mechanical pressure coming from the spring screw of assembling heatsink 13 since the inner side surfaces of the second electrical conductor 701 and the third electrical conductors 702, 703 are wave-shaped. Moreover, the outer side surfaces of the second electrical conductor 701 and the third electrical conductors 702, 703 are flat. Furthermore, the second electrical conductor 701 and the third electrical conductors 702, 703 are almost symmetric distribution on the sides of the first electrical conductors 411a, and all of the second electrical conductor 701 and the third electrical conductors 702, 703 are stand-offs located between the first printed circuit board 401 and the second printed circuit board 402. Namely, the second electrical conductor 701 and the third electrical conductors 702, 703 plus the first electrical conductors 411a can be served as supporters between the first printed circuit board 401 and the second printed circuit board 402 to share the mechanical pressure coming from the spring screw of assembling heatsink 13.

Figure 15:
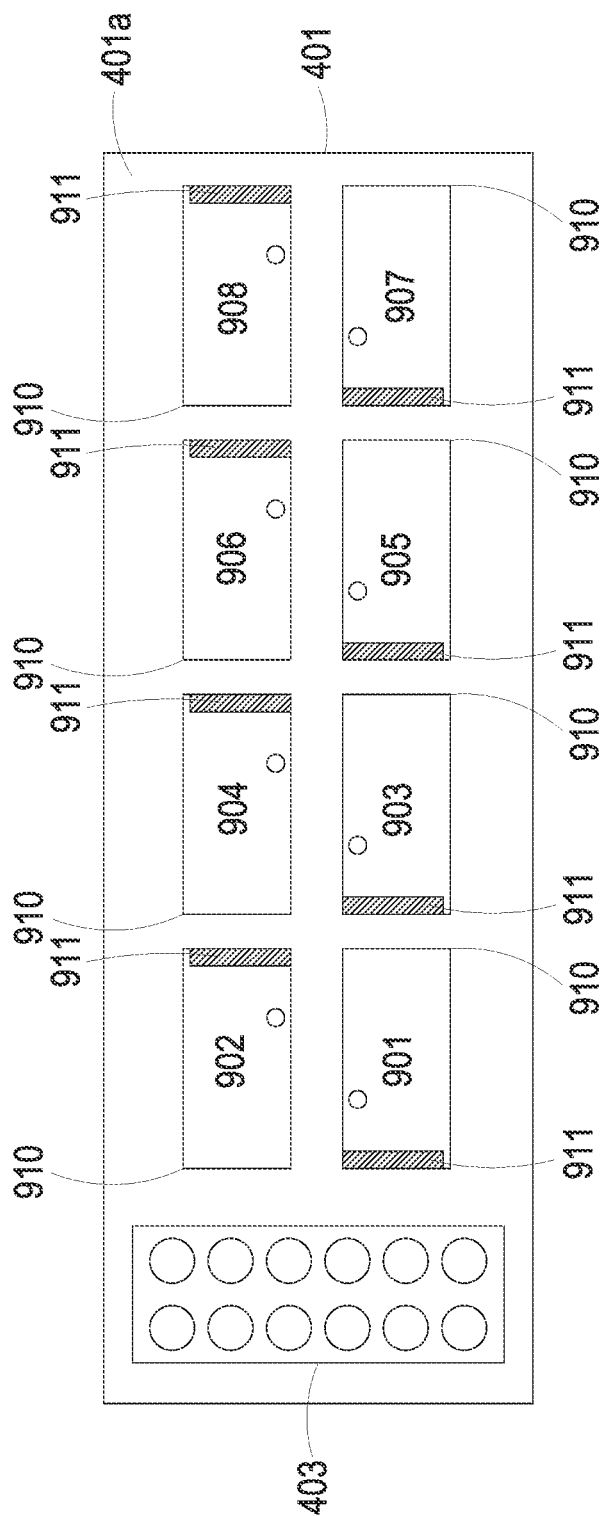
FIG. 15 is a schematic top view illustrating the first surface of the first printed circuit board of the power module of FIG. 12A.

FIG. 15 is a schematic top view illustrating the first surface of the first printed circuit board of the power module of FIG. 12A, wherein the input capacitors is omitted. As shown in FIGS. 12A, 12B and 15, the first printed circuit board 401 comprises a plurality of soldering areas 901, 902, 903, 904, 905, 906, 907, 908 disposed on the first surface 401a thereof. The eight Dr. MOS elements 20a in the four phase bulk circuits of the power module 3 are soldered on corresponding soldering areas 901 to 908, respectively. When the eight Dr. MOS elements 20a in the four phase bulk circuits of the power module 3 are disposed on the first surface 401a of the first printed circuit board 401, the long sides of all Dr. MOS elements 20a are parallel with the first side and the second side (i.e. long sides) of the first printed circuit board 401, wherein the first side and the second side are disposed between a third side and a fourth side (i.e. short sides) of the first printed circuit board 401. In addition, all of the Dr. MOS elements 20a are arranged in two rows. It is benefit to save the space of the first printed circuit board 401.

The installation directions of the four Dr. MOS elements 20a in the first row are identical. The installation directions of the four Dr. MOS elements 20a in the second row are identical. Moreover, the installation directions of the four Dr. MOS elements 20a in the first row and the installation directions of the four Dr. MOS elements 20a in the second row are opposite. In this design, the wires between the eight Dr. MOS elements 20a and the first terminals SW of the corresponding output inductors L are shorter. In this embodiment, the two Dr. MOS element 20a disposed on the soldering areas 901, 902 are connected in parallel to form the power circuit 10 in one phase. Similarly, the other two Dr. MOS element 20a disposed on the soldering areas 903, 904, the other two Dr. MOS element 20a disposed on the soldering areas 905, 906, and the other two Dr. MOS element 20a disposed on the soldering areas 907, 908 are respectively connected in parallel to form other power circuits 10 in the other three phases. The soldering areas 901 to 908 comprise first terminal areas 910 and second terminal areas 911, wherein the second terminals of the Dr. MOS element 20a are soldered on the first terminal areas 910, and the first terminals of the Dr. MOS element 20a are soldered on the second terminal areas 911. Moreover, the position of the first terminal areas 910 of the soldering areas 902, 904, 906, 908 are opposite to the position of the first terminal areas 910 of the soldering areas 901, 903, 905, 907, and the position of the second terminal areas 911 of the soldering areas 902, 904, 906, 908 are opposite to the position of the second terminal areas 911 of the soldering areas 901, 903, 905, 907. Therefore, the positions of the first terminals and the second terminals of the Dr. MOS element 20a on the soldering areas 901, 903, 905, 907 of the first surface of the first printed circuit board 401 are opposite to the first terminals and the second terminals of the other Dr. MOS element 20a on the soldering areas 902, 904, 906, 908 of the first surface of the first printed circuit board 401 and the terminals SW of two Dr. MOS element 20a in every phase can be close to the second terminal of the corresponding first electrical conductor 411a together so that the trace of the terminal SW of each of the output inductor L can be shorter.

Moreover, the plurality of input capacitors Cin can be disposed nearby the first terminal of the corresponding Dr. MOS element 20a so as to shorten the input trace of the Dr. MOS element 20a. Consequently, the layout of the Dr. MOS element 20a shown in FIG. 13 can be compact to achieve the small size and the high-power density of the power module 3. Furthermore, underfill is dispensed between the Dr. MOS element 20*a* and the soldering areas 901 to 908 in order to improve the mechanical pressure-resistant ability of the Dr. MOS element's 20*a* body and the Dr. MOS element's 20*a* solder joint, which can help to decrease the risk of failure caused by the spring screw of assembling heatsink 13.

In some embodiments, the first circuit board assembly 4 further comprises a molding compound layer. The first surface 401*a* of the first printed circuit board 401, the Dr. MOS elements 20*a* and the at least one input capacitor Cin are encapsulated by the molding compound layer through a plastic molding process. The configurations and functions of this embodiment are similar to those described in FIGS. 9 and 10, and are not redundantly described herein. In some embodiments, the Dr. MOS elements 20*a* and the input capacitors Cin are embedded in the first printed circuit board 401. The configurations and functions of this embodiment are similar to those described in FIGS. 11A and 11B, and are not redundantly described herein.

From the above descriptions, the present disclosure provides a power module. Since the power module of the present disclosure employs the first electrical conductors as the windings of the output inductors, the power loss of the output inductors can be reduced. In addition, since the first electrical conductors have good thermal conductivity and shorter length, the thermal resistance between the thermal sources and the casing of the electronic device or the heatsink is reduced by the first electrical conductors. Therefore, it is benefit to the power module to conduct the heat to the casing of the electronic device or the heatsink. At the same time, suitable inductance can be obtained according to the length of the first electrical conductors and the cross-sectional area of the magnetic core portion.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power system, comprising:
   a power module comprising a first surface, a second surface, a switch and a plurality of conductive parts, wherein the switch is disposed on the first surface of the power module and the plurality of conductive parts are disposed on the second surface of the power module;
   an electronic load comprising a plurality of conductive parts; and
   a system board;
   wherein the power module and the electronic load are disposed on two opposite sides of the system board, the power module delivers power to the electronic load through the system board, and gaps and networks of the plurality of conductive parts of the power module correspond to those of the plurality of conductive parts of the electronic load.

2. The power system according to claim 1, wherein the power module further comprises:
   a first circuit board assembly comprising a first printed circuit board and at least one power circuit, wherein the switch is used in the at least one power circuit, the first printed circuit board has a first surface and a second surface opposite to each other, and the first surface of the first printed circuit board is used as the first surface of the power module; and
   a second circuit board assembly comprising a second printed circuit board, wherein the second printed circuit board has a first surface and a second surface opposite to each other, the second surface of the second printed circuit board is disposed adjacent to the second surface of the first printed circuit board, and the first surface of the second printed circuit board is used as the second surface of the power module.

3. The power system according to claim 2, wherein the second circuit board assembly further comprises a plurality of pads and a plurality of conductive parts, the plurality of pads are disposed on the second surface of the second printed circuit board to form a first pattern, the plurality of conductive parts are disposed on the first surface of the second printed circuit board to form a second pattern and to be used as the plurality of conductive parts of the power module, and the plurality of pads are electrically connected with the plurality of conductive parts of the power module through the second printed circuit board.

4. The power system according to claim 3, wherein the first pattern is different from the second pattern.

5. The power system according to claim 3, wherein the power module further comprises:
   at least one first electrical conductor, wherein a first terminal of the at least one first electrical conductor is connected with the corresponding at least one power circuit, a second terminal of the at least one first electrical conductor is connected with the corresponding pad; and
   a magnetic core portion, wherein the magnetic core portion and the at least one first electrical conductor form a magnetic core assembly, the magnetic core portion comprises at least one core unit, and the core unit comprises at least one hole, wherein each of the at least one first electrical conductor is penetrated through the corresponding at least one hole of the magnetic core portion.

6. The power system according to claim 5, wherein the magnetic core assembly is disposed between the first circuit board assembly and the second circuit board assembly.

7. The power system according to claim 5, wherein the magnetic core assembly is an inductor.

8. The power system according to claim 5, wherein the at least one power circuit and the corresponding magnetic core assembly are connected with each other to define a phase circuit of the power module.

9. The power system according to claim 5, the magnetic core portion comprises a magnetic overlapping region, wherein a DC magnetic flux through the magnetic overlapping region is essentially balanced out.

10. The power system according to claim 9, wherein the magnetic overlapping region comprises a second magnetic overlapping region, and an AC magnetic flux through the second magnetic overlapping region is essentially balanced out.

11. The power system according to claim 9, wherein the magnetic overlapping region comprises a first magnetic overlapping region, and an AC magnetic flux through the first magnetic overlapping region is superposed.

12. The power system according to claim 5, wherein the at least one core unit comprises a plurality of core units, and the two adjacent core units are disposed adjacent to each other and overlapped with each other to form a first magnetic overlapping region on the magnetic core portion.

13. The power system according to claim 5, wherein the plurality of pads comprises a plurality of first soldering pads disposed on the second surface of the second printed circuit board, the first terminal of the first electrical conductor is soldered on the second surface of the first printed circuit board, and the second terminal of the first electrical conductor is soldered on the corresponding first soldering pad.

14. The power system according to claim 5, wherein the power module comprises at least one second electrical conductor and a plurality of third electrical conductors, the at least one second electrical conductor and the plurality of third electrical conductors are soldered between the second surface of the first printed circuit board and the second surface of the second printed circuit board, wherein the second electrical conductor forms a positive input terminal of the power module, and the third electrical conductors form a negative output terminal of the power module.

15. The power system according to claim 14, wherein each of the second electrical conductor and the plurality of third electrical conductors comprises at least one bump, the plurality of pads comprise at least one second soldering pad and a plurality of third soldering pads disposed on the second surface thereof, wherein the bump of the second electrical conductor is soldered on the corresponding second soldering pad and the bump of the third electrical conductor is soldered on the corresponding third soldering pad so as to form a plurality of receiving spaces between a plurality of bottom parts of the at least one second electrical conductor and the plurality of third electrical conductors and the second printed circuit board.

16. The power system according to claim 5, wherein the power module comprises a signal communication part, the signal communication part is disposed between the first printed circuit board and the second printed circuit board, and is adjacent to the magnetic core portion, wherein a signal is transmitted between the first circuit board assembly and the second circuit board assembly through the signal communication part.

17. The power system according to claim 2, wherein the power module further comprises at least one input capacitor, wherein the input capacitor is disposed on the first surface of the first printed circuit board.

18. The power system according to claim 2, wherein the power module further comprises a molding compound layer, wherein the molding compound layer is formed on the first surface of the first printed circuit board, the molding compound layer encapsulates the first surface of the first printed circuit board and the at least one power circuit, and an external surface of the molding compound layer is a flat surface.

19. The power system according to claim 2, wherein the second circuit board assembly further comprises at least one output capacitor disposed on the second surface of the second printed circuit board or embedded in the second printed circuit board, wherein a vertical projection of the at least one output capacitor on the system board at least partially overlaps with a vertical projection of the electronic device on the system board.

20. The power system according to claim 2, wherein the at least one power circuit is disposed on the first surface of the first printed circuit board.

21. The power system according to claim 2, wherein the at least one power circuit comprises at least two switch circuits, each switch circuit comprises a Dr. MOS element, the at least two Dr. MOS elements are disposed on the first surface of the first printed circuit board and arranged in parallel, each Dr. MOS element comprises a first terminal and a second terminal, the position of the first terminal of the Dr. MOS element on the first surface of the first printed circuit board is opposite to the position of the first terminal of the adjacent Dr. MOS element, the position of the second terminal of the Dr. MOS element on the first surface of the first printed circuit board is opposite to the position of the second terminal of the adjacent Dr. MOS element.

22. The power system according to claim 1, wherein the electronic load is a semiconductor die, a semiconductor device or a central processing unit.

23. The power system according to claim 1, wherein the plurality of conductive parts of the power module and the plurality of electronic loads are grid arrays.

24. The power system according to claim 23, wherein the plurality of conductive parts of the power module and the electronic load are ball grid arrays.

25. The power system according to claim 1, wherein a heat dissipation device is disposed adjacent to the switch to dissipate the heat from the switch.

* * * * *